United States Patent
Sreedharamurthy et al.

(10) Patent No.: US 8,551,247 B2
(45) Date of Patent: Oct. 8, 2013

(54) GENERATING A PUMPING FORCE IN A SILICON MELT BY APPLYING A TIME-VARYING MAGNETIC FIELD

(75) Inventors: Hariprasad Sreedharamurthy, Ballwin, MO (US); Milind Kulkarni, St. Louis, MO (US); Harold W. Korb, Chesterfield, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 1069 days.

(21) Appl. No.: 12/537,066

(22) Filed: Aug. 6, 2009

(65) Prior Publication Data

US 2010/0031870 A1 Feb. 11, 2010

Related U.S. Application Data

(60) Provisional application No. 61/087,117, filed on Aug. 7, 2008.

(51) Int. Cl.
*C30B 30/04* (2006.01)

(52) U.S. Cl.
USPC .......... 117/32; 117/13; 117/14; 117/15; 117/30

(58) Field of Classification Search
None
See application file for complete search history.

(56) References Cited

U.S. PATENT DOCUMENTS

| 7,223,304 B2 | 5/2007 | Lu |
| 7,291,221 B2 * | 11/2007 | Korb .............. 117/30 |
| 2006/0144320 A1 | 7/2006 | Korb |
| 2006/0144321 A1 | 7/2006 | Lu |
| 2007/0022943 A1 | 2/2007 | Hong et al. |
| 2007/0227442 A1 | 10/2007 | Lu |

FOREIGN PATENT DOCUMENTS

DE 19529481 A1 2/1997

OTHER PUBLICATIONS

Yesilyurt et al. "Electromagnetic control of convection in semiconductor melts: thermoelectromagnetic convection (TEMC) and rotating magnetic fields", Part of the SPIE Conference on Materials Research in Low Gravity II • Denver, Colorado, Jul. 1999.*
Galindo et al. "Crystal growth melt flow control by means of magnetic fields", Energy Conversion and Management, 2002, v. 43, pp. 309-316.*
PCT International Search Report and the Written Opinion regarding PCT/US2009/049069, Aug. 31, 2009, 12 pgs., International Searching Authority, Netherlands.
PCT International Search Report and the Written Opinion regarding PCT/US2009/053002, Sep. 17, 2009, 15 pgs., International Searching Authority, Netherlands.

(Continued)

*Primary Examiner* — Yelena G Gakh
(74) *Attorney, Agent, or Firm* — Armstrong Teasdale LLP

(57) ABSTRACT

Controlling crystal growth in a crystal growing system is described. The crystal growing system includes a heated crucible including a semiconductor melt from which a monocrystalline ingot is grown according to a Czochralski and the ingot is grown on a seed crystal pulled from the melt. The method includes applying a cusped magnetic field to the melt by supplying an upper coil with a first direct current ($I_{UDC}$) and supplying a lower coil with a second direct current ($I_{LDC}$). The method also includes supplying the upper coil with a first alternating current ($I_{UAC}$) and supplying the lower coil with a second alternating current ($I_{LAC}$) to generate a time-varying magnetic field, wherein the time-varying magnetic field generates a pumping force in the semiconductor melt.

16 Claims, 29 Drawing Sheets

(56) References Cited

OTHER PUBLICATIONS

D. Vizman et al., "ScienceDirect, Journal of Crystal Growth," Influence of Different Types of Magnetic Fields on the Interface Shape in a 200mm Si-EMCZ Configuration, 2007, 221-225 pgs., vol. 303 Issue 1, Elsevier, Erlangen, Germany.

Masahito Watanabe et al., "ScienceDirect, Journal of Crystal Growth," Large Modification of Crystal-Melt Interface Shape During Si Crystal growth by Using Electromagnetic Czochralski Method (EMCZ), 2006, 252-256 pgs., vol. 292 Issue 2, Elsevier, Erlangen, Germany.

* cited by examiner

ARROW: (Fr, Fz)
STREAMLINE: MAGNETIC FLUX DENSITY

ARROW: (Fr, Fz)
SUBDOMAIN MARKER: $PCMP_{Force}$ (N/m$^3$)

ARROW: (Fr, Fz)
SUBDOMAIN MARKER: PCMP$_{Force}$ (N/m$^3$)

ARROW: (Fr, Fz)
SUBDOMAIN MARKER: PCMP$_{Force}$ (N/m$^3$)

ARROW: (Fr, Fz)
SUBDOMAIN MARKER: PCMP$_{Force}$ (N/m$^3$)

ARROW: (Fr, Fz)
SUBDOMAIN MARKER: $PCMP_{Force} (N/m^3)$

GENERATING A PUMPING FORCE IN A SILICON MELT BY APPLYING A TIME-VARYING MAGNETIC FIELD

CROSS-REFERENCE TO RELATED APPLICATION

This application claims the benefit of U.S. Provisional Application No. 61/087,117, filed Aug. 7, 2008, which is hereby incorporated by reference in its entirety.

BACKGROUND

Single crystal silicon, which is the starting material in most processes for fabricating semiconductor electronic components, is commonly prepared according to the so-called Czochralski (Cz) process. In this process, polycrystalline silicon, or polysilicon, is charged to a crucible and melted, a seed crystal is brought into contact with the molten silicon, and a single crystal (also referred to herein as monocrystalline) ingot is grown by relatively slow extraction. After formation of a neck is complete, decreasing the pulling rate and/or the melt temperature enlarges the diameter of the crystal until a desired or target diameter is reached. The generally cylindrical main body of the crystal, which has an approximately constant diameter, is then grown by controlling the pull rate and the melt temperature while compensating for the decreasing melt level. Near the end of the growth process, but before the crucible is emptied of molten silicon, the crystal diameter is gradually reduced to form an end-cone. Typically, increasing the crystal pull rate and heat supplied to the crucible forms the end-cone. When the diameter becomes small enough, the crystal is then separated from the melt.

To produce semiconductor grade single crystal silicon, and more specifically, large, substantially defect-free crystals (e.g., crystals grown in a twenty-eight inch diameter crucible), the behavior of a solidification interface, which includes a peripheral edge of the crystal being grown, must be controlled. The solidification interface of the crystal being grown is also referred to herein as a melt-solid interface. A shape of the melt-solid interface is an important factor in obtaining a suitable process window for producing single crystal silicon.

Magnetic fields in various configurations have been used in the growth of silicon by the Cz process to modify the melt flow in order to control the incorporation of impurities and point defects. Typically, static or quasi-static fields are employed to create force fields which retard the melt motion established by the combination of thermal buoyant forces and rotations in an axisymmetric crystal growing system. The resultant melt flow is then determined by the design of the thermal environment, the rotations in the crystal puller, and the passive retarding force field. Because the design of the thermal environment is not readily modified, the thermal buoyant forces are not readily modified, and the process flexibility is therefore limited. It would be beneficial to have an additional control mechanism available to modulate the net body forces in the melt in order to establish melt flow patterns that create desired heat fluxes without modifying the hardware-dominated thermal environment.

Accordingly, improved control of the melt flow during the crystal growth process is desired to provide increased process flexibility for production of single crystal silicon.

BRIEF DESCRIPTION

In one aspect, a method of controlling crystal growth in a crystal growing system is provided. The crystal growing system includes a heated crucible including a semiconductor melt from which a monocrystalline ingot is grown according to a Czochralski and the ingot is grown on a seed crystal pulled from the melt. The method includes applying a cusped magnetic field to the melt by supplying an upper coil with a first direct current ($I_{UDC}$) and supplying a lower coil with a second direct current ($I_{LDC}$). The method also includes supplying the upper coil with a first alternating current ($I_{UAC}$) and supplying the lower coil with a second alternating current ($I_{LAC}$) to generate a time-varying magnetic field, wherein the time-varying magnetic field generates a pumping force in the semiconductor melt.

In another aspect, a system for growing silicon crystals that facilitates controlling a shape of a melt-solid interface is provided. The crystal growing system includes a heated crucible that includes a semiconductor melt from which a monocrystalline ingot is grown according to a Czochralski process. The ingot is grown on a seed crystal pulled from the melt, and the melt and the ingot form the melt-solid interface therebetween. The system includes a first set of coils and a second set of coils positioned adjacent to an exterior of the crucible for generating a cusped magnetic field. The system also includes a control unit configured to supply at least one of a first time-varying alternating current ($I_{UAC}$) to the first set of coils and a second time-varying alternating current ($I_{LAC}$) to the second set of coils to generate a time-varying magnetic field. The time-varying magnetic field generates a pumping force in the semiconductor melt.

In yet another aspect, a method for generating a pumping force in a semiconductor melt undergoing a Czochralski process of monocrystalline silicon ingot growth is provided. The system includes storing alternating current profiles for a first alternating current ($I_{UAC}$) and a second alternating current ($I_{LAC}$). The method also includes energizing the first and second coils with $I_{UAC}$ and $I_{LAC}$, respectively, to generate a time-varying magnetic field, wherein the time-varying magnetic field generates a pumping force in the semiconductor melt.

DETAILED DESCRIPTION

Many existing crystal growing systems employ axisymmetric two-coil magnets which can be used to create either axial magnetic fields (if the currents in the coils are in the same direction) or cusp-shaped fields (if the currents are in opposite directions). The magnets are typically operated in a quasi-static mode. In the case of cusp-shaped fields, the field strength is small and approximately horizontal near the growth interface (e.g., zero degrees from horizontal to five degrees from horizontal), while near the axis the field is approximately vertical (e.g., zero degrees from vertical to three degrees from vertical). The magnets may be superconducting or conventional. Superconducting magnets typically have a large number of turns in each coil, a large inductance, and the current is not modulated easily. In contrast, conventional magnets typically have a relatively small number of turns in each coil, a moderate inductance, and the current is easily modulated. In the methods and systems described herein, transient currents are used to induce currents in the highly conductive melt, especially in conventional magnet systems, to create force fields through the interaction of the induced currents and the instantaneous magnetic field in the melt, without making electrical contact with the melt. In an exemplary embodiment, the techniques described herein are used with existing magnet systems to provide an additional degree of control to the motion of the melt.

Controlling a shape of a melt-solid interface is an important factor in determining the quality of silicon crystal produced. The shape of the melt-solid interface is dependent on process parameters such as, but not limited to, temperatures, crucible or crystal rotation, and crystal pulling rate. By fixing these process parameters, the melt-solid interface is also fixed. In an exemplary embodiment, a magnetic field applied during the crystal growing process also affects the shape of the melt-solid interface. Magnetic fields may be used to stabilize convective flows in metal and semiconductor melts and to dampen natural convective flow and turbulence. There are three conventional types of magnetic field configurations used to stabilize convective flows in conductive melts, namely, axial, horizontal, and cusped.

Figure 1:
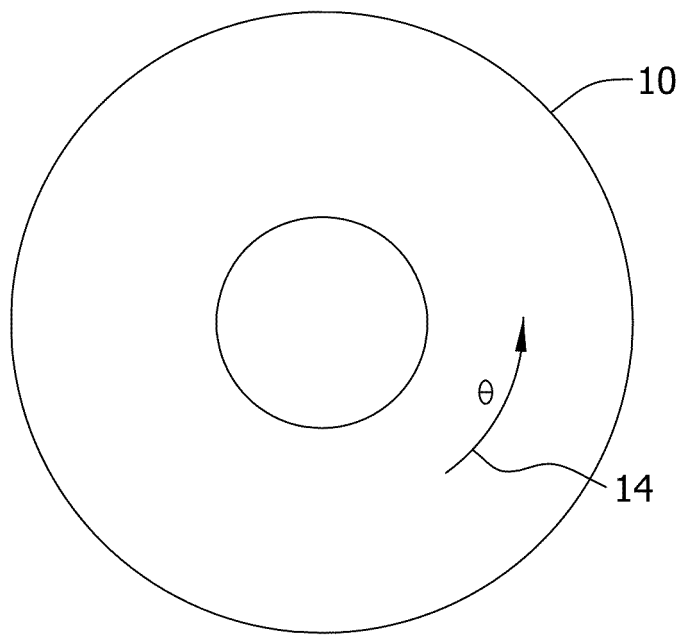
FIGS. 1 and 2 illustrate an exemplary crucible and cylindrical coordinate system.
Figure 2:
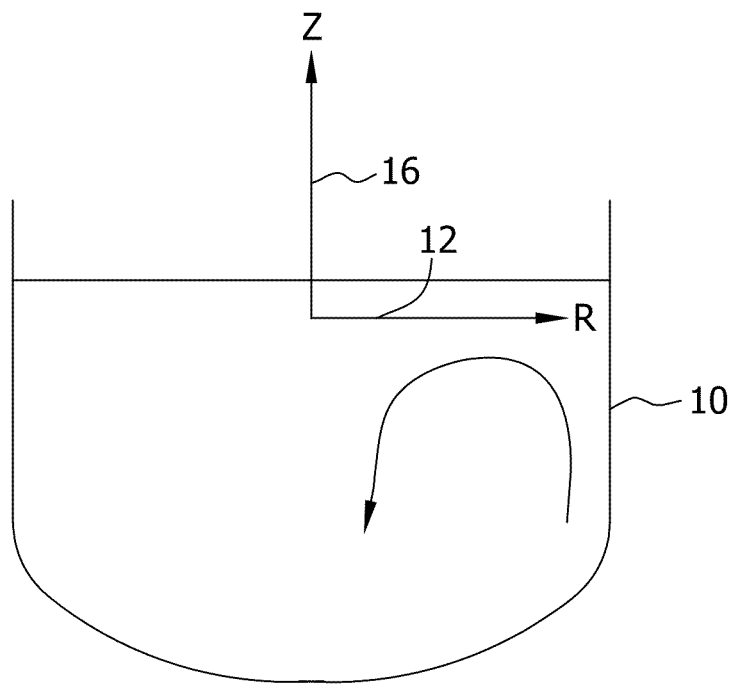

FIGS. 1 and 2 illustrate an exemplary crucible 10 and a cylindrical coordinate system. The cylindrical coordinate system includes coordinates R 12, θ 14, and Z 16. Coordinates R 12, θ 14, and Z 16 are used herein to describe the methods and systems for generating pumping force in a silicon melt.

Figure 3:
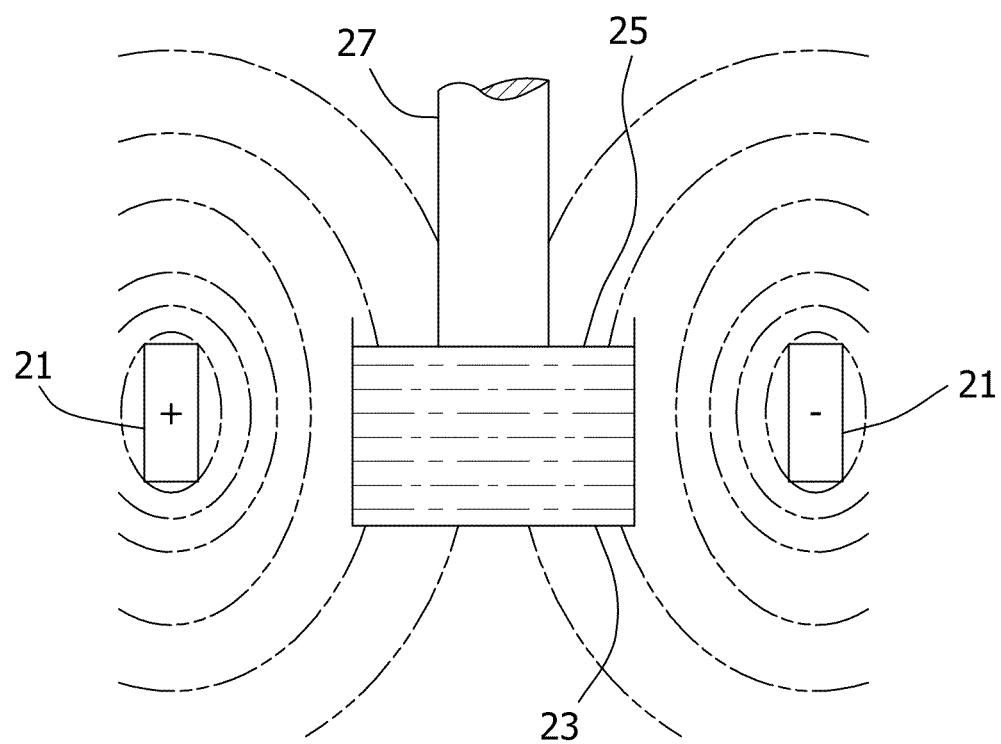
FIG. 3 is a block diagram illustrating an axial (also referred to herein as vertical) magnetic field being applied to a crucible containing a melt in a crystal growing apparatus.

FIG. 3 is a block diagram illustrating an axial (also referred to herein as vertical) magnetic field being applied to a crucible 23 containing a melt 25 in a crystal growing apparatus. The axial magnetic field configuration generates a magnetic field parallel to the crystal-growth direction. In FIG. 3, a magnet coil 21, shown in cross-section, supplies a magnetic field to crucible 23. As shown, crucible 23 contains silicon melt 25 from which a crystal 27 is grown.

Figure 4:
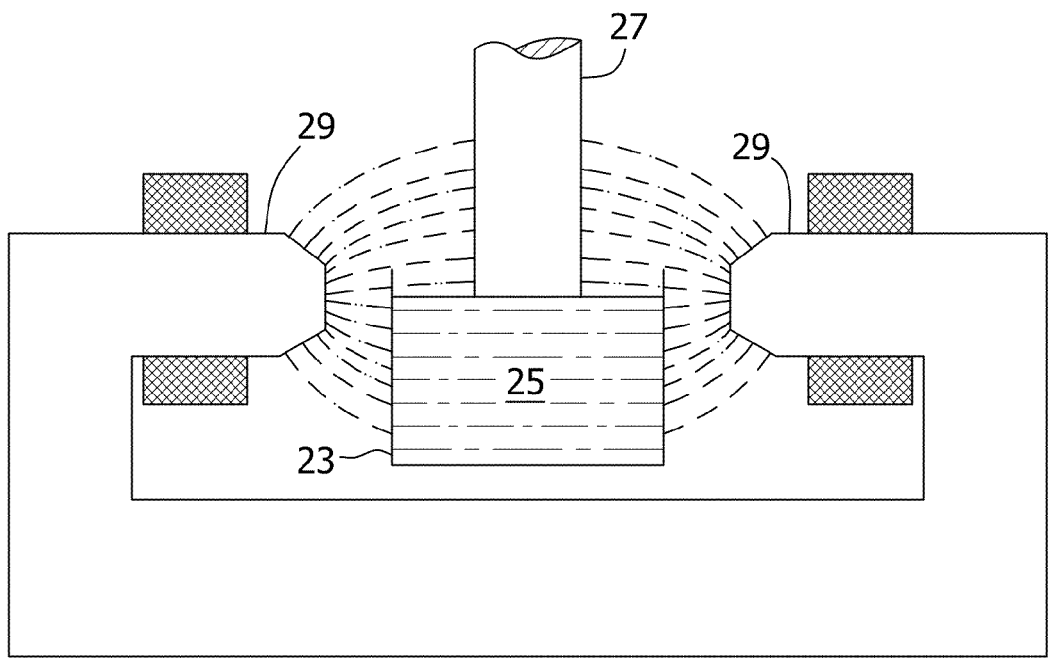
FIG. 4 is a block diagram illustrating a horizontal (also referred to herein as transverse) magnetic field being applied to a crucible containing a melt in a crystal growing apparatus.

FIG. 4 is a block diagram illustrating a horizontal (also referred to herein as transverse) magnetic field being applied to crucible 23, which contains melt 25, in a crystal growing apparatus. In the horizontal magnetic field configuration, two magnetic poles 29 are placed in opposition to generate a magnetic field perpendicular to the crystal-growth direction.

Figure 5:
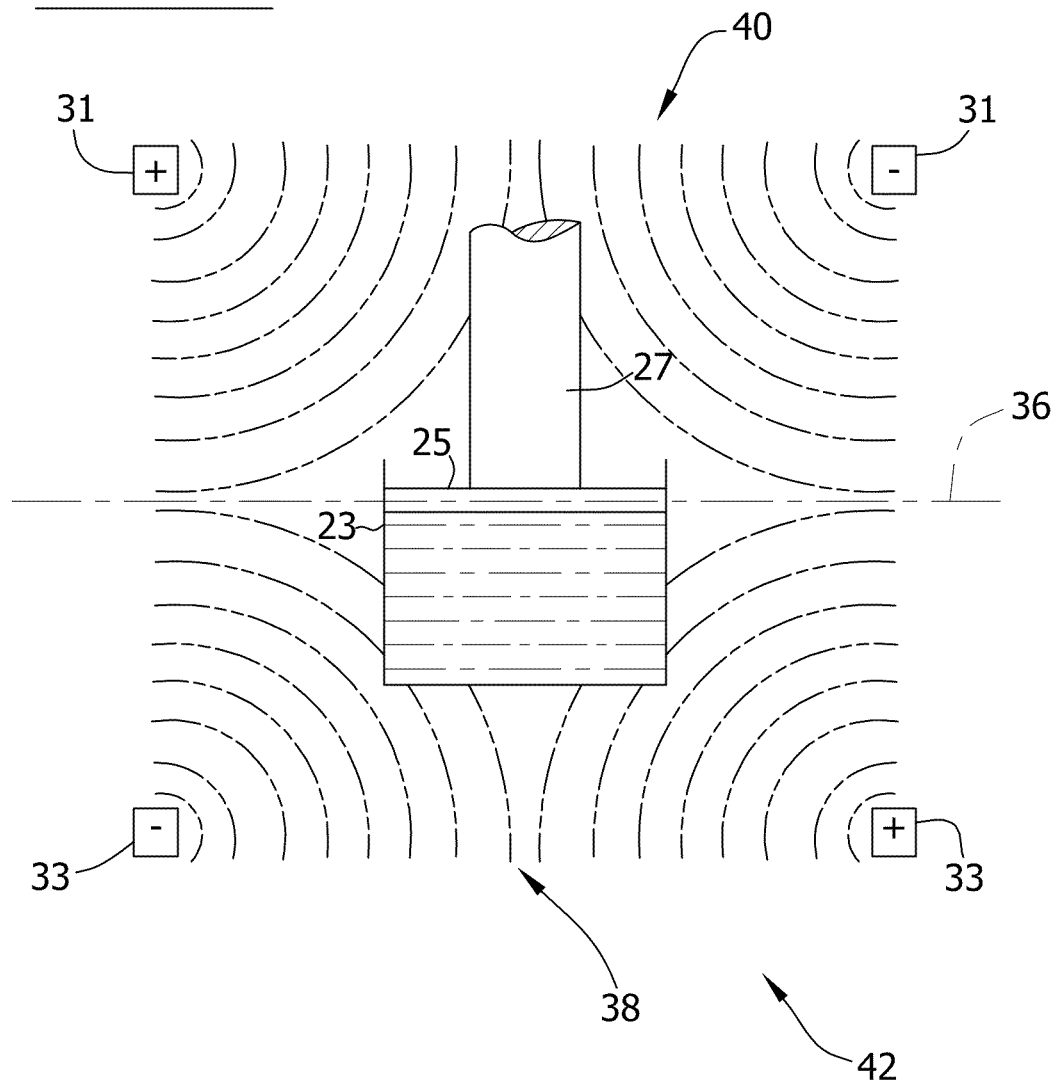
FIG. 5 is a block diagram illustrating a cusped magnetic field being applied to a crucible containing a melt in a crystal growing apparatus.

FIG. 5 is a block diagram illustrating a cusped magnetic field being applied to crucible 23, which contains melt 25, in a crystal growing apparatus. The cusped magnetic field configuration is designed to overcome deficiencies of the axial and horizontal magnetic field configurations. A pair of coils 31 and 33 (e.g., Helmholtz coils) placed coaxially above and below a melt surface 36 and operated in an opposed current mode to generate a magnetic field that has a purely radial field component near the melt surface 36 and a purely axial field component near a center 38 of the melt 25. The combination of an upper magnetic field 40 and a lower magnetic field 42, produced by coils 31 and 33 respectively, results in axial and radial cusped magnetic field components.

Figure 6:
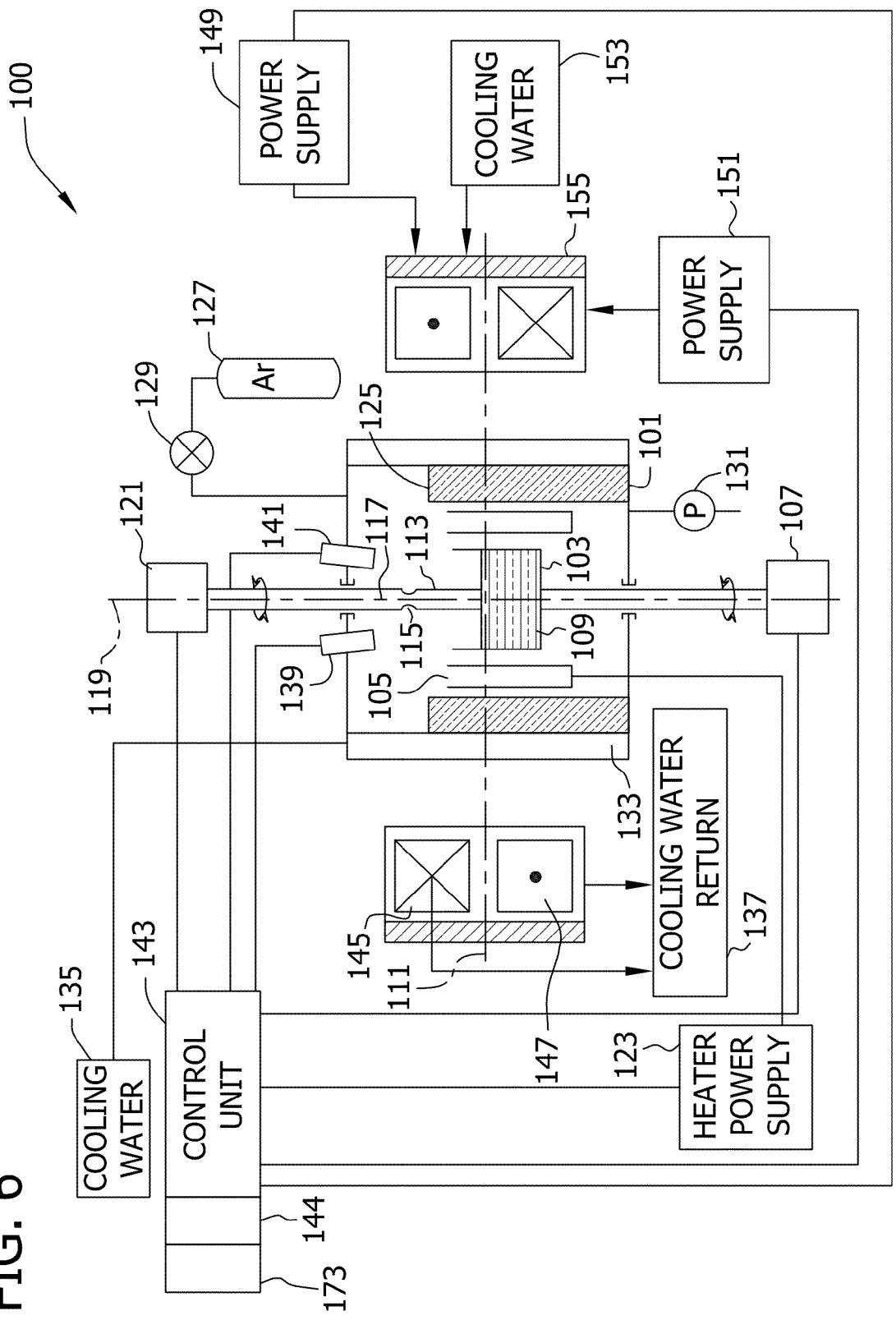
FIG. 6 is a block diagram of an exemplary crystal growing system.

FIG. 6 is a block diagram of an exemplary crystal growing system 100. System 100 employs a Czochralski crystal growth method to produce a semiconductor ingot. In an exemplary embodiment, system 100 is configured to produce a semiconductor ingot having a diameter of approximately three-hundred millimeters (300 mm). In other embodiments, system 100 is configured to produce a semiconductor ingot having a two-hundred millimeter (200 mm) diameter or a four-hundred and fifty millimeter (450 mm) diameter. In general, the crystal growing system 100 includes a vacuum chamber 101 enclosing a crucible 103. A heater 105, for example, a resistance heater, surrounds the crucible 103. During heating and crystal pulling, a crucible drive unit 107 (e.g., a motor) rotates crucible 103, for example, in the clockwise direction as indicated by the arrow. The crucible drive unit 107 may also raise and/or lower crucible 103 as desired during the growth process. Within crucible 103 is a silicon melt 109 having a melt level 111. In operation, system 100 pulls a single crystal 113, starting with a seed crystal 115 attached to a pull shaft or cable 117, from the melt 109. One end of the pull shaft or cable 117 is connected by way of a pulley (not shown in FIG. 6) to a drum (not shown in FIG. 6), or any other suitable type of lifting mechanism, for example, a shaft, and the other end is connected to a chuck (not shown in FIG. 6) that holds the seed crystal 115 and the crystal 113 grown from seed crystal 115.

Crucible 103 and single crystal 113 have a common axis of symmetry 119. Crucible drive unit 107 can raise crucible 103 along axis 119 as the melt 109 is depleted to maintain its level 111 at a desired height. A crystal drive unit 121 similarly rotates pull shaft or cable 117 in a direction opposite the direction in which crucible drive unit 107 rotates crucible 103 (e.g., counter-rotation). In embodiments using iso-rotation, the crystal drive unit 121 may rotate pull shaft or cable 117 in the same direction in which crucible drive unit 107 rotates crucible 103 (e.g., in the clockwise direction). Iso-rotation may also be referred to as a co-rotation. In addition, crystal drive unit 121 raises and lowers the crystal 113 relative to melt level 111 as desired during the growth process.

According to the Czochralski single crystal growth process, a quantity of polycrystalline silicon, or polysilicon, is charged to crucible 103. A heater power supply 123 energizes the resistance heater 105, and insulation 125 lines the inner wall of the vacuum chamber 101. A gas supply 127 (e.g., a bottle) feeds argon gas to vacuum chamber 101 via a gas flow controller 129 as a vacuum pump 131 removes gas from vacuum chamber 101. An outer chamber 133, which is fed with cooling water from a reservoir 135, surrounds vacuum chamber 101.

The cooling water is then drained to a cooling water return manifold 137. Typically, a temperature sensor such as a photocell 139 (or pyrometer) measures the temperature of melt 109 at its surface, and a diameter transducer 141 measures the diameter of single crystal 113. A control unit 143 may include a processor 144 that processes the signals generated by the photocell 139 and the diameter transducer 141. The control unit 143 may be a programmed digital or analog computer that controls crucible drive unit 107, crystal drive unit 121, heater power supply 123, vacuum pump 131, and gas flow controller 129 (e.g., an argon flow controller). The term processor, as used herein, refers to central processing units, microprocessors, microcontrollers, reduced instruction set circuits (RISC), application specific integrated circuits (ASIC), logic circuits, and any other circuit or processor capable of executing the functions described herein. In the exemplary embodiment, system 100 does not include an upper heater. The presence of an upper heater, or lack of an upper heater, alters cooling characteristics of the crystal 113.

In the exemplary embodiment, an upper magnet, such as a solenoid coil 145, and a lower magnet, such as a solenoid coil 147, may be located above and below, respectively, melt level 111. In the exemplary embodiment, the coils 145 and 147, shown in cross-section, surround vacuum chamber 101 and share axes with axis of symmetry 119. In some embodiments, the upper and lower coils 145 and 147 have separate power supplies, namely, an upper coil power supply 149 and a lower coil power supply 151, each of which is connected to and controlled by control unit 143.

In an exemplary embodiment, current flows in opposite directions in the two solenoid coils 145 and 147 to produce a magnetic field. A reservoir 153 provides cooling water to the upper and lower coils 145 and 147 before draining via cooling water return manifold 137. A ferrous shield 155 surrounds coils 145 and 147 to reduce stray magnetic fields and to enhance the strength of the field produced.

In the exemplary embodiment, system 100 produces silicon crystal ingots suitable for use in device manufacturing. Advantageously, system 100 may be used to produce silicon crystal 113, a substantial portion or all of which is substantially free of agglomerated intrinsic point defects. That is, a substantial portion or all of crystal 113 produced may have a density of defects of less than about $1 \times 10^4$ defects/cm$^3$, less than about $5 \times 10^3$ defects/cm$^3$, less than about $1 \times 10^3$ defects/cm$^3$, or even no detectable agglomerated intrinsic point defects. Furthermore, system 100 may be used to produce crystal 113 having substantially no agglomerated defects that are larger than about sixty nanometers (nm) in diameter.

Figure 7:
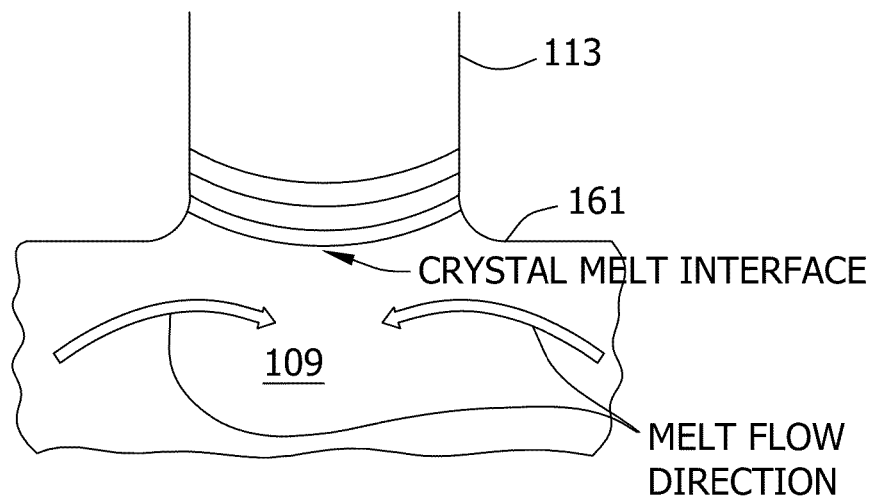
FIGS. 7 and 8 illustrate exemplary melt-crystal interfaces.
Figure 8:
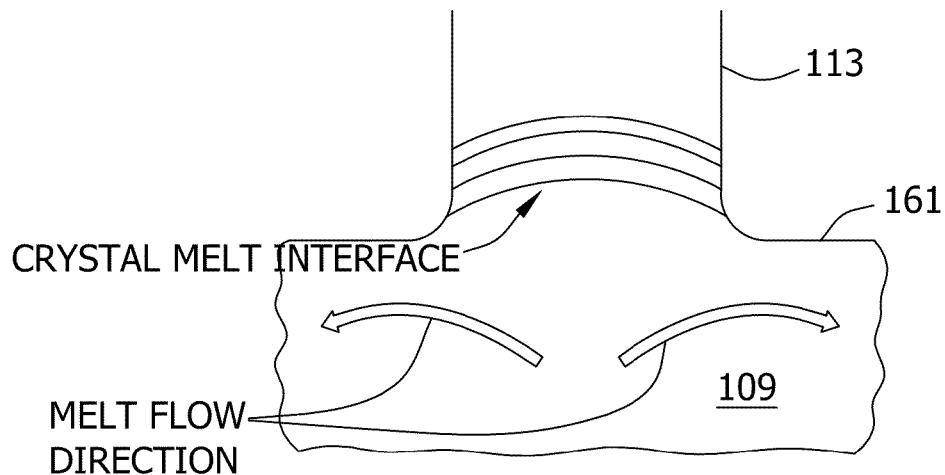

The shape of the melt-solid or melt-crystal interface is controlled during crystal growth to limit and/or suppress the formation of agglomerated intrinsic point defects. FIGS. 7 and 8 illustrate exemplary melt-solid interfaces, extending from a melt surface 161. The shape of the melt-solid interface between melt 109 and silicon crystal 113 may be concave (shown in FIG. 8) or convex (shown in FIG. 7) in shape relative to the crystal 113, or a combination of both concave and convex (also referred to as a "gull-wing" shape). As described below, controlling the melt-solid interface shape facilitates a reduction in crystal growth defects.

In the exemplary embodiment, melt convection is employed to affect the melt-solid interface shape. Convection refers to the process of heat transfer in a liquid by the movement of the liquid itself. In general, there are two types of convection: natural convection and forced convection. Natural convection occurs when the movement of melt 109 is due, for example, to the presence of heater 105 giving rise to density gradients. Forced convection occurs when the movement of the melt 109 is due to an external agent such as a magnetic field in crucible 103. Accordingly, controlling the magnetic field, and therefore the movement of the melt 109, may facilitate producing a desired melt-solid interface shape.

Figure 9:
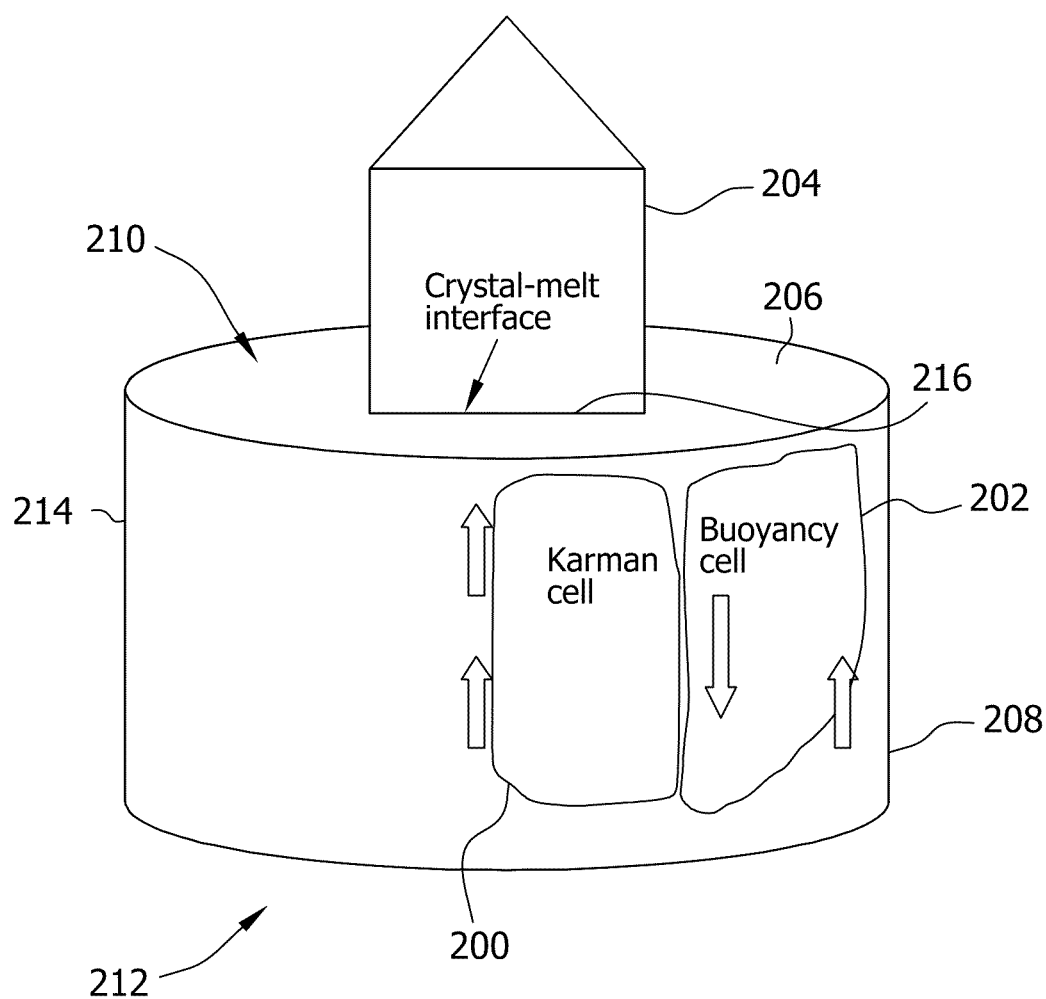
FIG. 9 is a schematic diagram of melt flow cells formed during crystal growth.

FIG. 9 is a schematic diagram of melt flow cells 200 and 202 formed during crystal growth. In the exemplary embodiment, a crystal 204 is pulled from a melt 206 held within a crucible 208. Crucible 208 includes a top 210, a bottom 212, and a crucible wall 214. In the exemplary embodiment, melt flow cells 200 and 202 are formed in melt 206 during crystal 204 growth occurring while crystal 204 and crucible 208 are rotated in the same direction (i.e., iso-rotation). More specifically, the two types of flow cells formed in melt 206 are a Karman cell 200 and a buoyancy cell 202. The Karman cell 200 is formed directly below crystal 204 and the buoyancy cell 202 is formed along crucible wall 214. Different flow cells are formed under counter-rotation conditions, including an Eckmann cell (not shown in FIG. 9). The presence of an Eckmann cell does not facilitate formation of as concave of a melt-solid interface 216 as does the presence of Karman cell 200.

Strengthening Karman cell 200 facilitates the formation of a more concave melt-solid interface 216 shape relative to crystal 204 (shown in FIG. 8). Karman cell 200 can be made stronger by either applying an axial magnetic field or by increasing the component of the axial magnetic field in an applied cusped magnetic field. The axial magnetic field also has an effect of increasing a melt temperature at bottom 212 of crucible 208, bringing in more heat, which also facilitates formation of a more concave shape of melt-solid interface 216.

Figure 10:
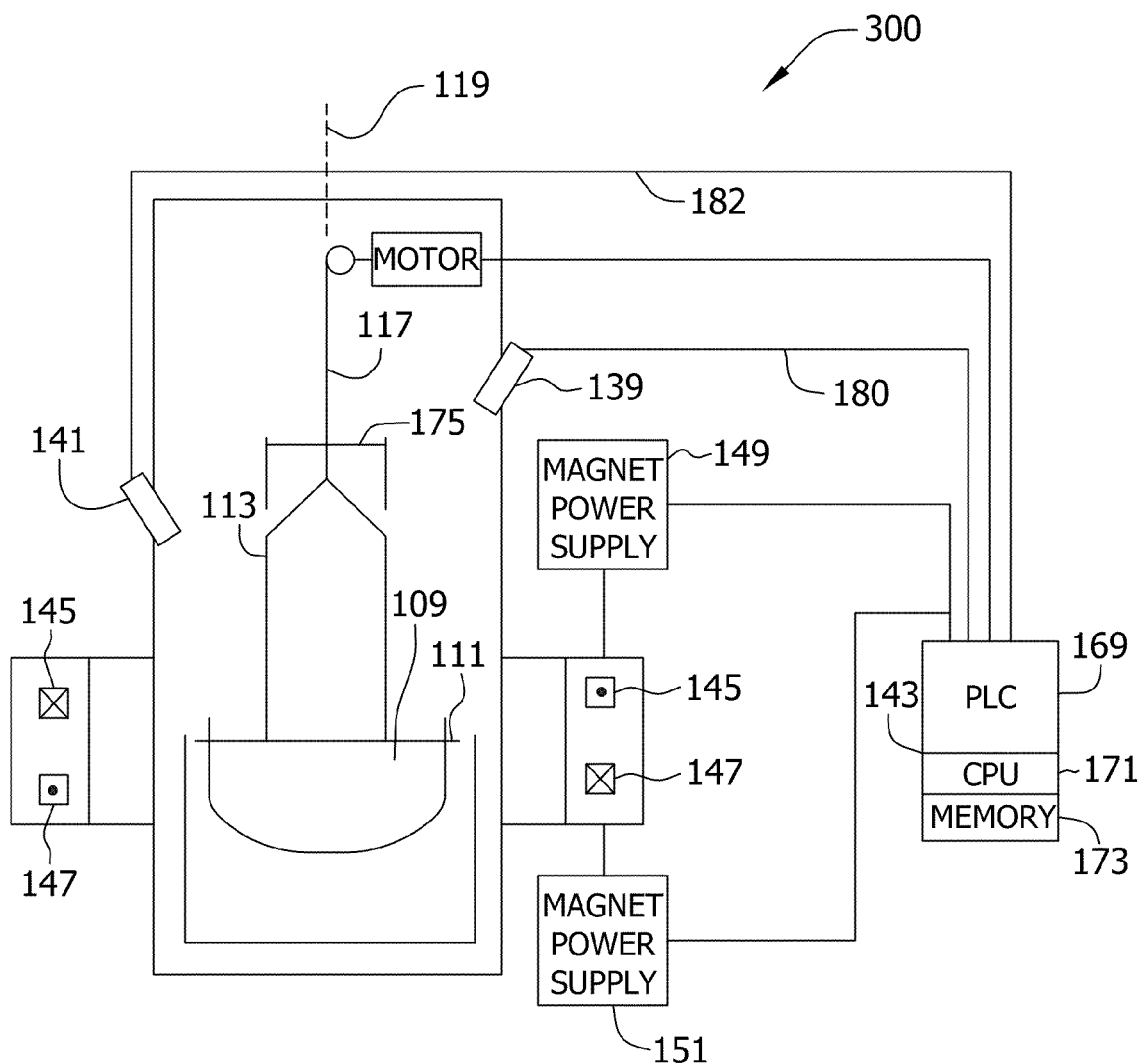
FIG. 10 is a block diagram illustrating components of a crystal growing apparatus control system configured to apply a time-varying magnetic field to generate a pumping force in the melt.

FIG. 10 is a block diagram of an exemplary crystal growing system 300 for generating a pumping force in the melt 109. In an exemplary embodiment, system 300 includes control unit 143 (shown in FIG. 6). The control unit 143 may include a programmable logic controller (PLC) 169, processor 144 (shown in FIG. 6), for example, but not limited to, a central processing unit (CPU) 171, and a memory 173 that are connected to one or more input/output (I/O) devices (e.g., 139 and 141) for receiving an input signal representative of a sensed growth parameter such as temperature of the melt 109 and/or a diameter 175 of the crystal 113. An image processor (not shown in FIG. 10) processes images of the melt-solid interface to determine diameter 175. When diameter 175 becomes small enough, crystal 113 is then separated from the melt 109. In the exemplary embodiment, CPU 171 is configured to determine a direction and a magnitude of a pumping force to counteract a buoyant force from the buoyancy cell, and also a set of characteristics that define the time-varying magnetic field that will produce the pumping force. CPU 171 may make the determinations in real-time, periodically, at a set time, or at any other suitable time that allows system 300 to function as described herein. In the exemplary embodiment, CPU 171 is positioned within the control unit 143, however, CPU 171 may be positioned remotely from control unit 143 as long as CPU 171 is communicatively coupled to the control unit 143.

In the exemplary embodiment, memory 173 stores target growth parameter data such as a target diameter, and/or target profile data. Target profile data includes, for example, output current set points for each of the magnet power supplies 149 and 151 as a function of crystal length. The upper and lower coils 145 and 147 are energized via magnet power supplies 149 and 151 to produce a cusped magnetic field. An ideal cusped magnetic field has a radial component approximately horizontal at melt surface 111 and an axial component approximately vertical on the axis 119 of the crystal puller, for example, pull shaft 117. Control unit 143 controls power supplies 149 and 151 which supply currents to the upper and lower coils 145 and 147, respectively, that are substantially equal in magnitude and opposite in polarity. Such currents facilitate creation of a cusped magnetic field. For example, control unit 143 facilitates generating a cusped magnetic field by controlling power supply 149 to supply a current having a value of −100 amperes to the upper coil 145 and controlling power supply 151 to supply a current having a value of +100 amperes to the lower coil 147. Notably, the "−" and "+" are used to indicate that the currents in the upper and lower coils flow in opposite directions.

Upper and lower coils 145 and 147 are made such that when they are operating at the same power distribution (e.g., both at the same percentage of the maximum current input), the cusp position remains at melt level 111 (e.g., the melt-solid interface). CPU 171 is responsive to the generated signals, received via links 180 and 182, and/or the stored target data to modify the power distributions in upper and lower coils 145 and 147 to move the cusp position up or down and to change the relative magnitudes of axial or radial components of the magnetic field. For example, control unit 143 controls power distribution to increase or decrease, respectively, the axial component of the magnetic field relative to the radial component in order to move the plane at which the magnetic field is horizontal to melt level 111, above or below melt level 111.

The control unit 143 controls power supplies 149 and 151 to change the currents being supplied to upper and lower coils 145 and 147 in the same algebraic direction to achieve a nominally cusped magnetic field with an increasing axial field component. For example, control unit 143 controls the upper power supply 149 to increase the amount of current being supplied to upper coil 145 from about −100 amperes (amps) to toward about −95 amps (i.e., less negative) and controls power supply 151 to increase the amount of current being supplied to lower coil 147 from about +100 amps to toward about +105 amps. As an alternative example, to achieve a nominally cusp-shaped magnetic field with a decreasing axial field component, the control unit 143 controls power supply 149 to decrease the amount of current being supplied to the upper coil 145 from about −100 amps to toward about −105 amps (i.e., more negative) and controls power supply 151 to decrease the amount of current being supplied to the lower coil 147 from about +100 amps to toward about +95 amps. As will be described below, increasing or decreasing the axial component of the magnetic field induces a current in the melt 109 while the axial component of the magnetic field is changing. The induced current interacts with the magnetic field being applied to the melt 109 to produce forces in the melt 109 that contribute to or oppose a general rolling motion of the melt which normally results from global thermal convection.

Figure 11:
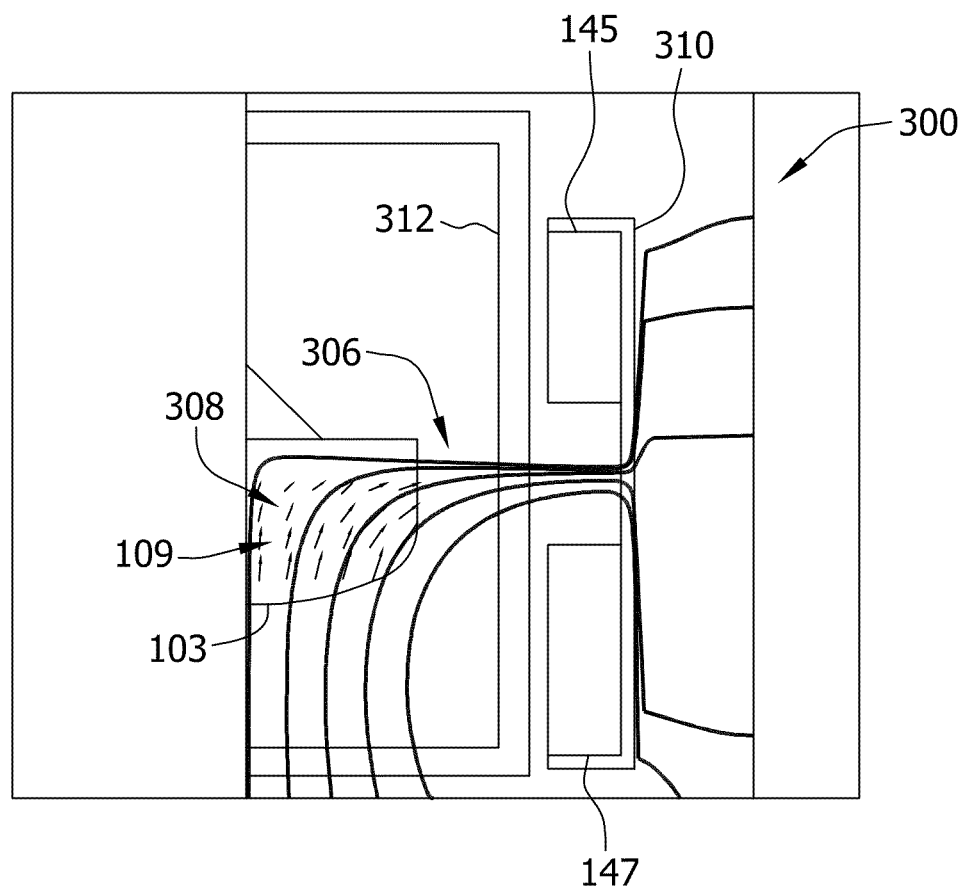
FIGS. 11-23 are partial cross-sectional views of a portion of the system shown in FIG. 10.

FIG. 11 is a partial cross-sectional view of a portion of system 300 (shown in FIG. 10). More specifically, FIG. 11 is an axisymmetric model that represents a typical Cz system which can be operated to generate a cusped magnetic field, shown by multiple "streamlines" 306 and multiple arrows 308. In an exemplary embodiment, system 300 includes a twenty-eight inch outer-diameter crucible 103 charged with a 250 kg silicon melt 109. System 300 also includes upper and lower coils 145 and 147, with unequal coil sizes, a high-permeability magnetic shunt 310 enclosing coils 145 and 147, and a cylindrical stainless steel vessel 312 enclosing the melt 109 and crystal 113 (shown in FIG. 10). The numerical markers indicate the minimum (e.g., ~0 teslas (T)) and the maximum (e.g., 0.03 T) magnitudes of the magnetic flux density (B) in melt 109 achieved with 100-ampere coil currents in opposite directions (i.e., upper coil 145 supplied with current having phase of 180 degrees, and lower coil 147 supplied with current having phase of zero). Streamlines 306 show the magnetic flux density applied to crucible 103.

Magnet coils 145 and 147 are shown as large entities while in an exemplary embodiment they are multi-turn coils. As each coil has the same current in each of its conductors comprising the coil, and the conductors have a uniform cross-sectional area, the azimuthal current density in each coil is uniform, so the representation as a single large entity with a uniform current density is accurate. The current density is determined by dividing the coil current from a power supply by the conductor cross-sectional area (e.g., $1.72 \times 10^{-4}$ m$^2$). Everything in the system except the magnet shunt 310 is linear, so for simplicity herein, whenever possible, calculations are made with coil currents of 100 A, allowing for easy scaling of results to other currents.

Some of the material parameters used in the model are shown in Table 1. The value for the permeability of the shunt material was chosen to give good agreement (e.g., ~1%) between the calculated values of flux density and the values measured along three axes in an actual system.

TABLE 1

Exemplary Material Parameters.

| Parameter | Symbol | Silicon Melt | Magnetic Shunt |
|---|---|---|---|
| Conductivity (S/m) | σ | $1.46 \times 10^6$ | |
| Relative Permittivity | ε | 12.1 | |
| Relative Permeability | μ | | 500 |
| Coefficient of Volume Expansion (K$^{-1}$) | β | $1.5 \times 10^{-5}$ | |

As used herein, a definition of "useful force fields" is chosen to be the thermally generated buoyancy in the melt. If ρ is the density, g is gravitational acceleration, and ΔT is the temperature difference above the melting point, the buoyant force per unit volume is calculated using Equation 1 or Equation 2.

$$F_{buoy} = \rho \beta g \Delta T \tag{1}$$

$$F_{buoy} = 0.375 \Delta T \text{N}/(\text{m}^3 \text{ K}) \tag{2}$$

If ΔT is as large as 100 K, then $F_{buoy}$ would be 37.5 N/m$^3$. Accordingly, any forces comparable to this value are of practical importance in determining the melt flow.

Figure 12:
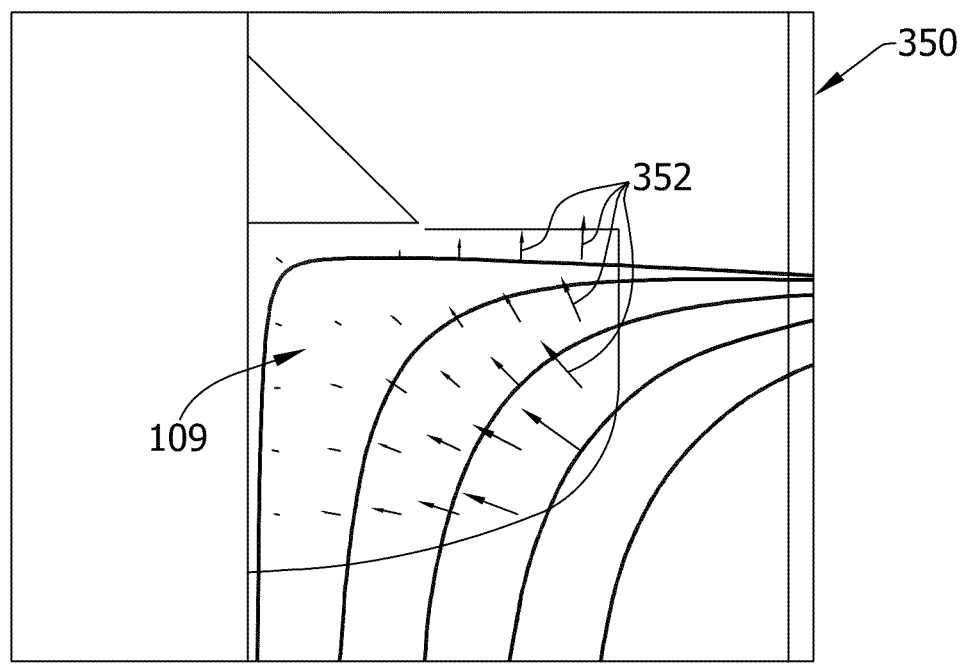

In the exemplary embodiment, superposition of sinusoidal current signals upon static currents in, for example, coils 145 and 147 (shown in FIG. 10), produce useful force fields in melt 109 which facilitate modifying the melt flow. In some embodiments, the methods and systems described herein use Phase Controlled Magnetic Pumping (PCMP) to control the phase of imposed sinusoidal transient currents. Similarly, superposition of a linear current ramp on both coils 145 and 147 facilitates modifying the melt flow in melt 109. FIG. 12 is a partial cross-sectional view 350 of a portion of system 300 (shown in FIG. 10). More specifically, FIG. 12 illustrates body forces (shown by, for example, arrows 352) in the melt 109 generated by superimposing a ramped axial field (generated by a linear current ramp) upon a cusped magnetic field. The values shown are captured at the instant when the magnet currents are equal and opposite, the magnitude of the lower current is increasing, and the magnitude of the upper current is decreasing.

Referring to FIG. 12, in at least one embodiment, a 100 A quiescent current is applied to coil 145 and a 100 A quiescent current is applied to coil 147 in an opposite direction. A current ramp of 10 A/sec is superimposed in both coils 145 and 147 in the same direction. The superimposed current ramp generates an increasing axial field that is superimposed on the quiescent cusped magnetic field. In other words, if a current ramp of 10 A/sec in both coils in the same direction is superimposed on the quiescent currents, an increasing axial field is superimposed on the quiescent cusped magnetic field. The linearly increasing axial flux density ($B_z$) in melt 109, with a corresponding increasing magnetic flux through the surface of melt 109, induces a constant electric field in the $-\theta$ direction (shown in FIG. 1) in melt 109. Current will flow in the $-\theta$ direction in melt 109 and interact with the instantaneous magnetic field B to produce forces 352 in melt 109. Forces 352 are normal to the instantaneous direction of the magnetic flux density B, and, in an exemplary embodiment, the magnitude of forces 352, $PCMP_{Ramp\ Force}$, is 37.5 N/m³ at the location of its maximum value. Given the symmetry and linearity of system 300, if a decreasing axial field is superimposed rather than an increasing axial field, the sign of $J_\theta$ would be reversed, the direction of B would not be reversed, and the signs of $F_r$ and $F_z$ would be reversed. The magnitudes would remain the same.

Figure 13:
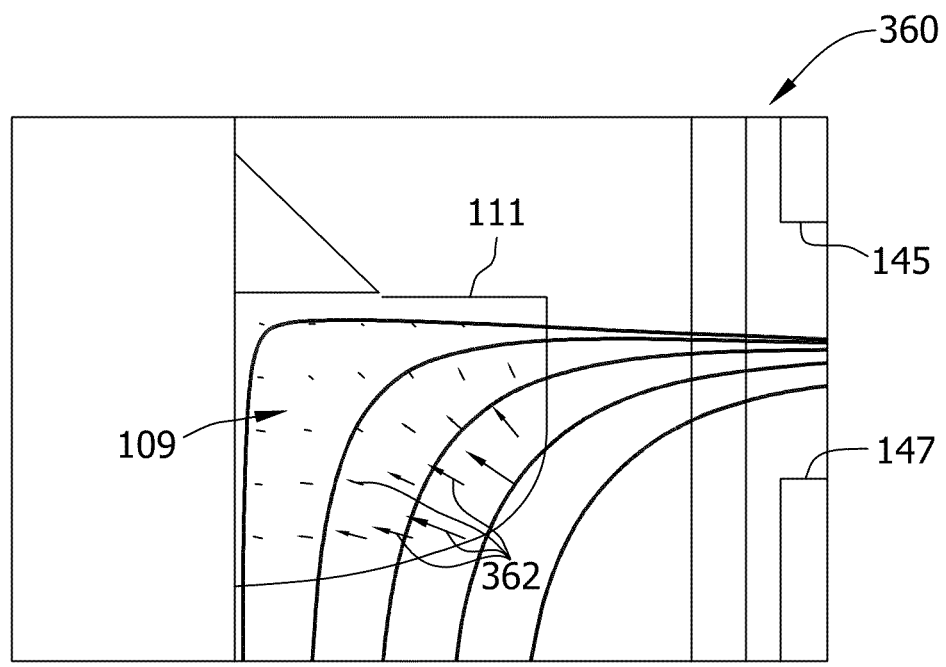

FIG. 13 is a partial cross-sectional view 360 of a portion of system 300 (shown in FIG. 10). More specifically, FIG. 13 illustrates body forces (shown by, for example, arrows 362) in melt 109 generated by steadily ramping a magnitude of a cusped magnetic field. The values shown are captured at the instant when the current applied to coil 145 is substantially equal to the current applied to coil 147, while the magnitude of both currents is increasing.

In an alternative embodiment, rather than superimposing the axial field on the quiescent cusped magnetic field (shown in FIG. 12), the magnitude of the cusped magnetic field is increased. In the alternative embodiment, the current in both coil 145 and coil 147 is increased at the same ramp rate of 10 A/sec, in the appropriate directions to maintain the same shape of the magnetic field distribution but steadily increase its magnitude. The body forces 362 developed are shown in FIG. 13. In an exemplary embodiment, the maximum values of the forces 362 are smaller than the forces 352 (shown in FIG. 12), and the forces 362 developed near the melt surface 111, along the locus of the cusp, are especially reduced. As before, if the direction of the ramp is reversed, the forces 362 would be in the opposite direction to those in FIG. 13, and their magnitudes would be equal to the values shown at the instant when the current is 100 A in both coils 145 and 147.

These two exemplary cases illustrate that moderate coil current transients (e.g., 10 A/sec) develop meaningful body forces (e.g., forces 352 and 362) in the melt 109. The forces 352 and 362 and field shapes were plotted at times corresponding to instantaneous current values of 100 A in the coils 145 and 147. However, linear current ramps have limited sustainability, and the magnetic field shape and strength are changing substantially, causing forces 352 and 362 to change substantially with time. In the exemplary embodiment, the use of sinusoidal magnet currents, possibly superimposed on quiescent currents in the coils, facilitates a reduction in these limitations.

If each of coils 145 and 147 (shown in FIG. 10) have a quiescent current $I_{DC}$ and a sinusoidal perturbation of the current with amplitude $I_{AC}$, angular frequency $\omega$, and phase $\phi$, a total current ($I_L$) applied to lower coil 147 and a total current ($I_U$) applied to upper coil 145 are as shown in Equations 3 and 4, respectively:

$$I_L = I_{LDC} + I_{LAC}\cos(\omega_L t + \phi_L) \quad (3)$$

$$I_U = I_{UDC} + I_{UAC}\cos(\omega_U t + \phi_U) \quad (4)$$

or in complex notation:

$$I_L = I_{LDC} + I_{LAC}Re\{e^{i(\omega_L t + \phi_L)}\} \quad (5)$$

$$I_U = I_{UDC} + I_{UAC}Re\{e^{i(\omega_U t + \phi_U)}\} \quad (6)$$

Some embodiments operate with $I_{UAC}$ and $I_{LAC}$ at the same frequency, so $\omega_U = \omega_L = \omega$.

For a system with time-harmonic behavior, a real field F(r,t) can be written as:

$$F(r,t) = F_1(r)\cos(\omega t + \phi) = Re\{F_1(r)e^{i\phi}e^{i\omega t}\} = Re\{F'(r)e^{i\omega t}\} \quad (7)$$

where $F_1(r)$ is real, and the phasor F'(r) is complex and contains the amplitude and phase information about F(r,t). The time dependence of F(r,t) is contained in the factor $e^{i\omega t}$.

In cases where two fields interact, such as the calculation of the Lorentz force F=J×B, care is exercised in dealing with the complex expressions, since the real quantities are operating on one another. In an exemplary embodiment, the time average of the instantaneous forces developed in the melt is of interest. If $I_{LDC}$ and $I_{UDC}$ produce a static field $B_{DC}$, and $I_{LAC}$ and $I_{UAC}$ produce a harmonic field $B_{AC}$, then the total magnetic flux density is:

$$B_{TOTAL} = B_{DC} + B_{AC} \quad (8)$$

and $B_{AC}$ is written in phasor form as $Re\{B'(r)e^{i\omega t}\}$ in Equation 9:

$$B_{TOTAL} = B_{DC} + B_{AC} = B_{DC} + Re\{B'(r)e^{i\omega t}\} \quad (9)$$

where $B_{DC}$ is static. Since J is also time dependent, it can be written as $Re\{J'(r)e^{i\omega t}\}$, so the instantaneous force is then given by:

$$F(r) = J \times B_{TOTAL} = [Re\{J'(r)e^{i\omega t}\}] \times [B_{DC}(r) + Re\{B'(r)e^{i\omega t}\}] \quad (10)$$

where J'(r) and B'(r) are complex and $B_{DC}(r)$ is real. Exemplary embodiments calculate the time average of the force, given the calculated J'(r) and B'(r). The real part of any complex number may be written as $Re(z)=0.5(z+z^*)$, so Equation 10 expands to read:

$$F(r) = 0.5\{J'(r)e^{i\omega t} + J'^*(r)e^{-i\omega t}\} \times \{B_{DC}(r) + 0.5[B'(r)e^{i\omega t} + B'^*(r)e^{-i\omega t}]\} \quad (11)$$

Expanding this further by carrying out all of the cross products explicitly results in terms containing either $e^{i\omega t}$, $e^{-i\omega t}$, $e^{2i\omega t}$, $e^{-2i\omega t}$, or $e^0$. In calculating the time average of F(r), the terms containing $e^0$ give non-zero contributions. Carrying out a final rearrangement of the terms, the result is shown in Equation 12:

$$F_{AV}(r) = 0.5 Re\{J'(r) \times B'^*(r)\} \quad (12)$$

If $\omega_U \neq \omega_L$, there are terms in the expansion of Equation 11 with sum and difference frequencies of $\omega_U \pm \omega_L$, but no term with zero frequency, so the time average would be zero. If $\omega_U$ and $\omega_L$ were nearly equal, the force on the melt would exhibit beat frequencies, which may be detrimental to crystal production.

In an exemplary embodiment, $B_{DC}$ does not contribute to the determination of $F_{AV}(r)$. Not considering $I_{LDC}$ and $I_{UDC}$ in the analysis simplifies the analysis for individual cases.

As described herein, $F_{AV}(r)$ will be referred to as the Phase Controlled Magnetic Pumping (PCMP) force. The PCMP force is created by imposing sinusoidal transient currents on the instantaneous magnetic field in melt 109. The PCMP force, ($F_{AV}(r)$), obtained by superimposing the sinusoidal currents $I_{LAC}$ and $I_{UAC}$ upon the quiescent currents $I_{LDC}$ and $I_{UDC}$ is independent of $I_{LDC}$ and $I_{UDC}$ and the static field $B_{DC}(r)$. Any crystal growth process utilizing a "baseline" magnetic field $B_{DC}(r)$ can be modulated by the use of the PCMP method to "tune" the baseline process.

In some examples, current inputs $I_{LAC}$ and $I_{UAC}$ are set to amplitudes of 100 A, unless otherwise noted, and $I_{LDC}$ and $I_{UDC}$ are set to zero. Note that 100 A currents would be quite large. The DC values in FIG. 11 were 100 A, giving a static B magnitude of 0.03 T. But since all of these results can be scaled, 100 A is a convenient value to use for the calculations. And, the actual current is divided by the cross-sectional area of the conductors in the magnet coils to give the current density in the coils, which is the physically relevant parameter. The phase $\phi_L$ was defined to be zero, and the phase $\phi_U$ was set at various values relative to $\phi_L$. Several examples of the system response are shown to illustrate the behavior (see FIGS. 14-18). Notably, these instantaneous force values neglect the effect of the quiescent B field, but the time-averaged force values are still valid, as indicated in Equation 12.

Figure 14:
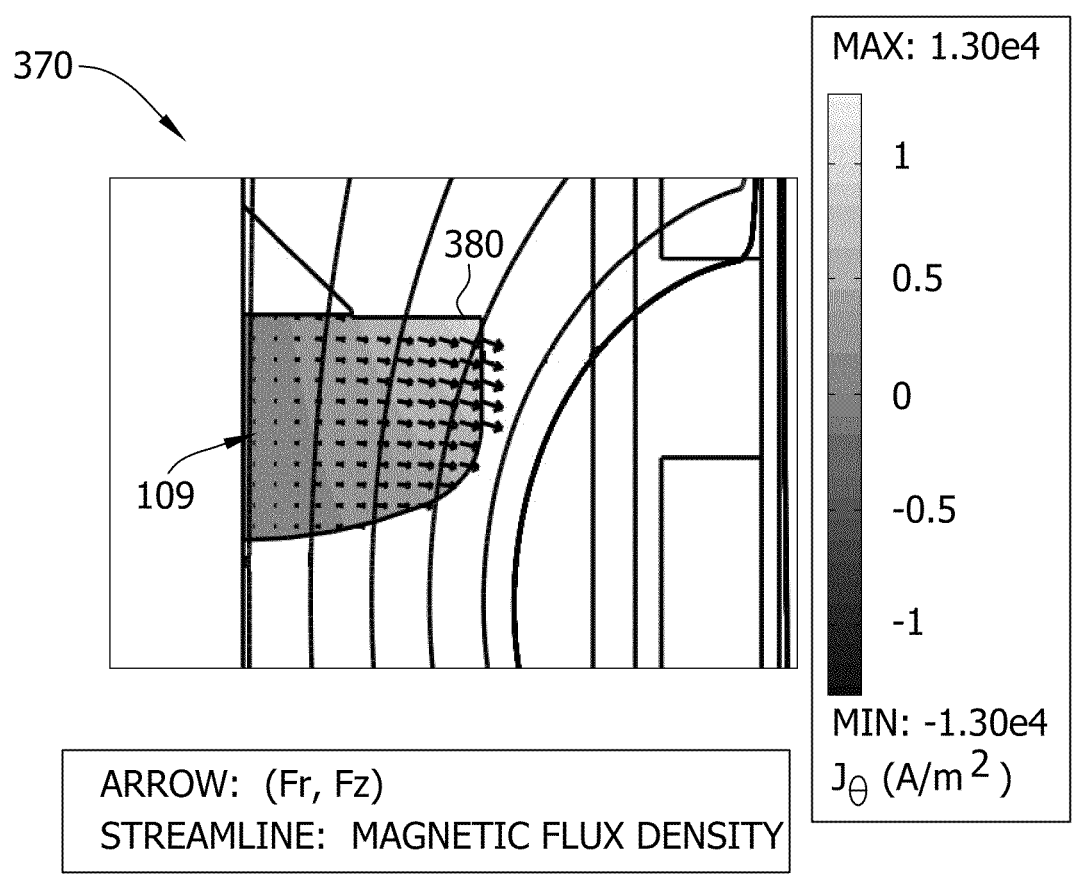

FIG. 14 is a partial cross-sectional view 370 of a portion of system 300 (shown in FIG. 10). More specifically, FIG. 14 shows an instantaneous current, magnetic flux direction, and PCMP forces in the melt produced by sinusoidal magnet currents of amplitude 100 A and frequency 0.25 Hz, at zero degrees in the harmonic cycle. For example, FIG. 14 shows the instantaneous effects in the melt when $I_{UAC}$ leads $I_{LAC}$ by 90 degrees and $I_{LAC}$ is at its maximum value (i.e., with the phase=zero in the harmonic cycle). Since $I_{UAC}$ leads $I_{LAC}$ by 90 degrees, $I_{UAC}$ is zero and decreasing, and it consequently induces a current in the melt in the +θ direction. That induced local current $J_\theta$ interacts with B to produce the instantaneous force field represented as ($F_r$, $F_z$).

In an exemplary embodiment, the maximum value of $J_\theta$ is approximately $1.3 \times 10^4$ A/m². The maximum local force density in the melt is approximately 267 N/m³ near an upper corner 380 of the melt 109, and the direction is essentially radial. This graphical scheme is used to display various results (see FIGS. 15-18).

Figure 15:
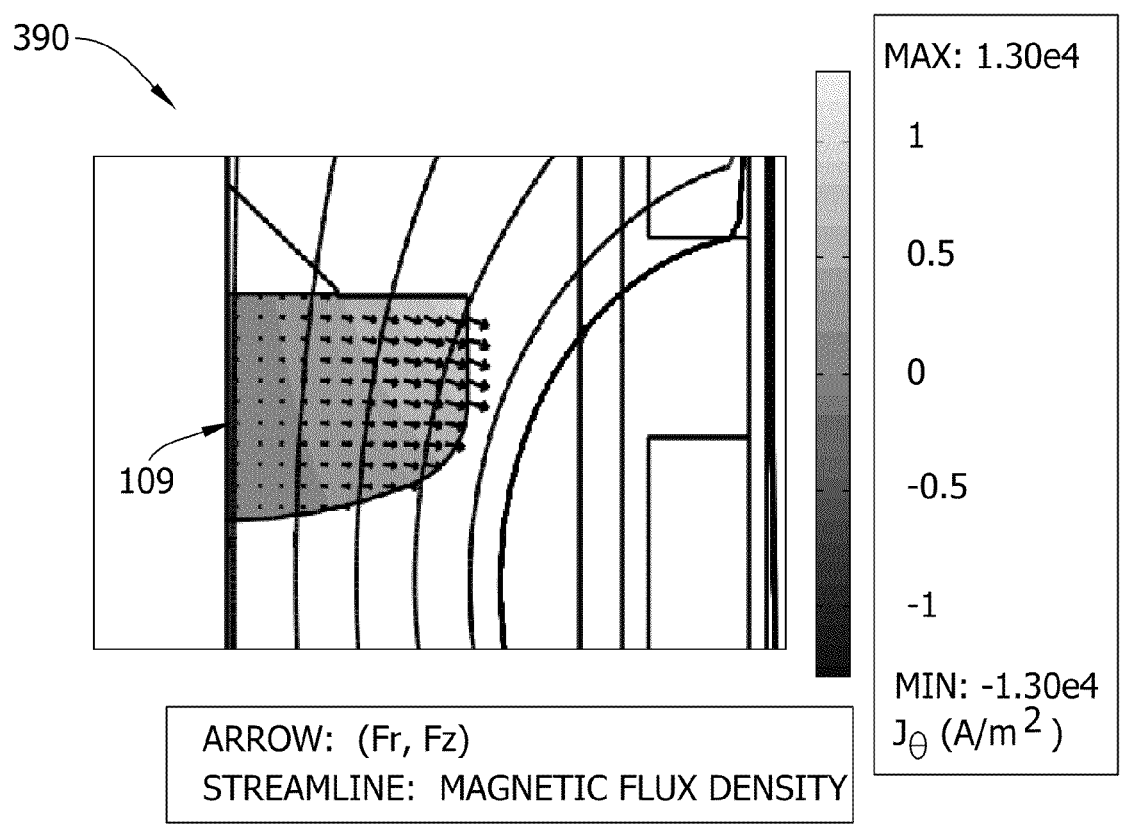

FIGS. 15-18 are partial cross-sectional views 390, 400, 410, and 420 of a portion of system 300 (shown in FIG. 10). More specifically, FIGS. 15-18 illustrate instantaneous current, magnetic flux direction, and PCMP forces in the melt produced by sinusoidal magnet currents of amplitude 100 A and frequency 0.25 Hz with $I_{UAC}$ and $I_{LAC}$ having different phases. FIG. 15 shows instantaneous current, magnetic flux direction, and PCMP forces in the melt produced by sinusoidal magnet currents of amplitude 100 A and frequency 0.25 Hz with $I_{UAC}$ leading $I_{LAC}$ by 90 degrees.

Figure 16:
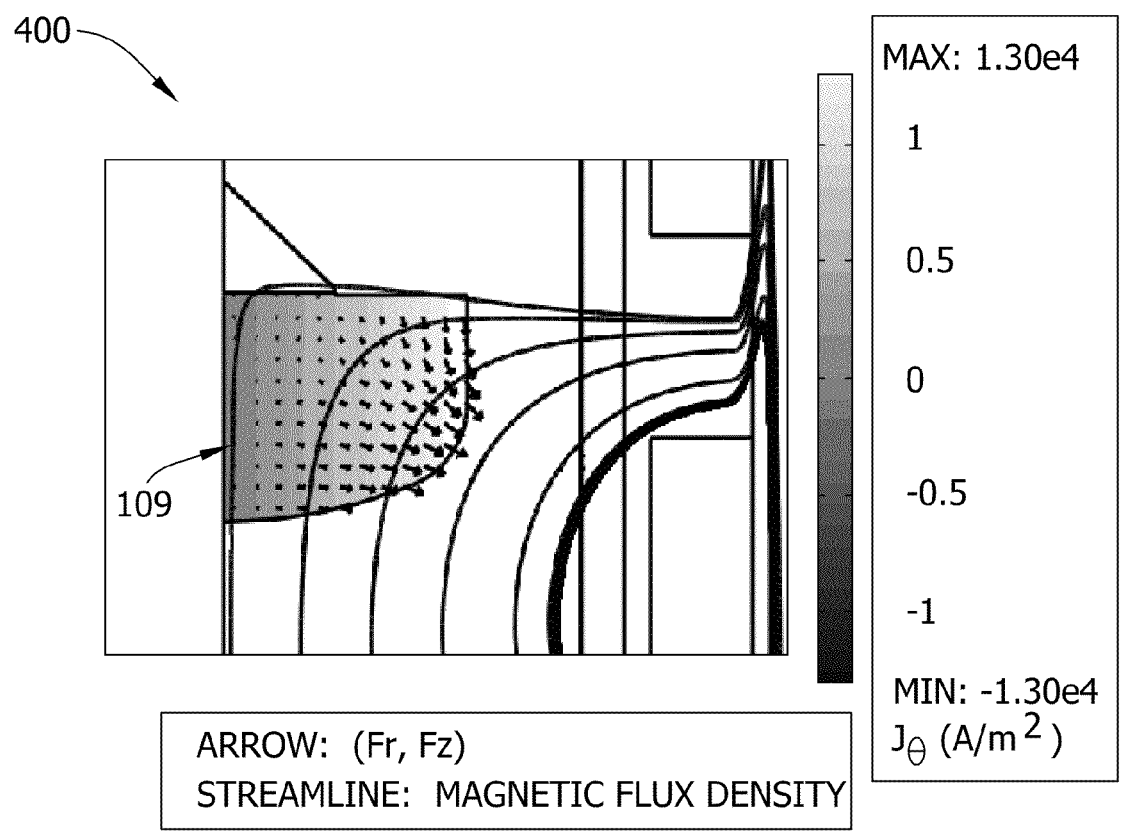
Figure 17:
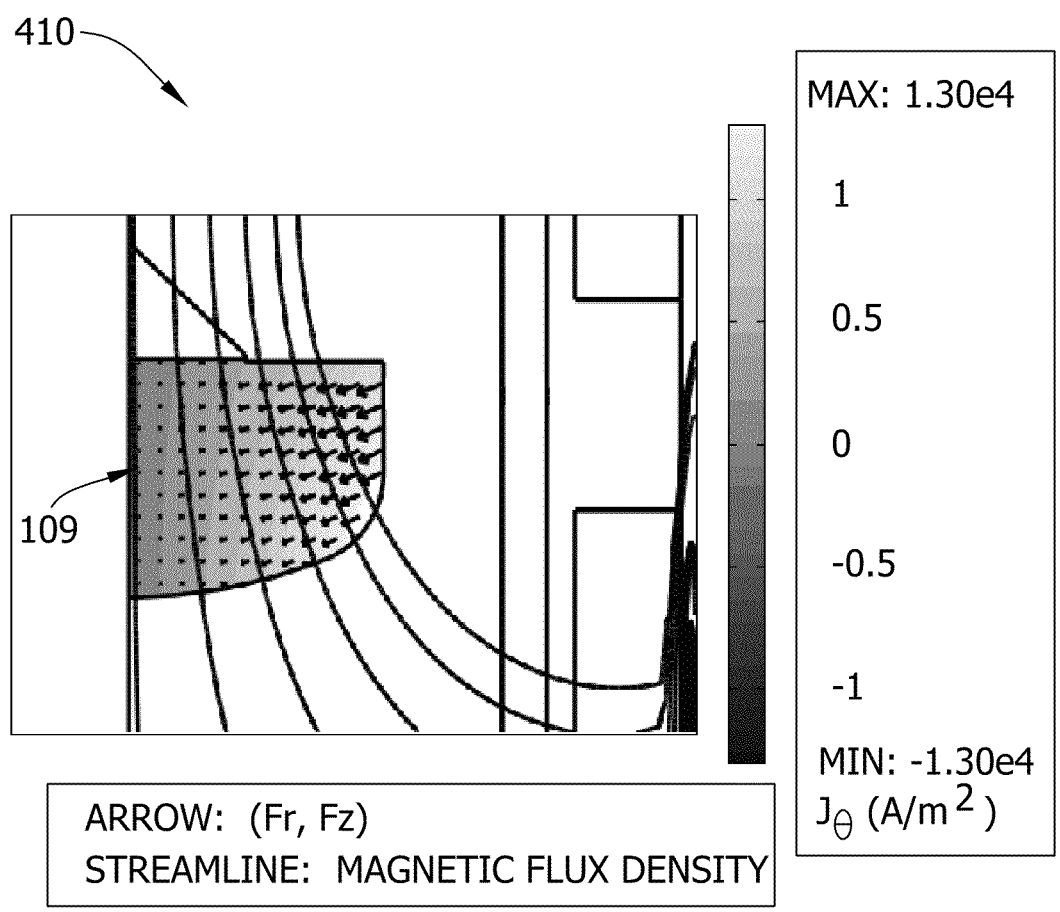
Figure 18:
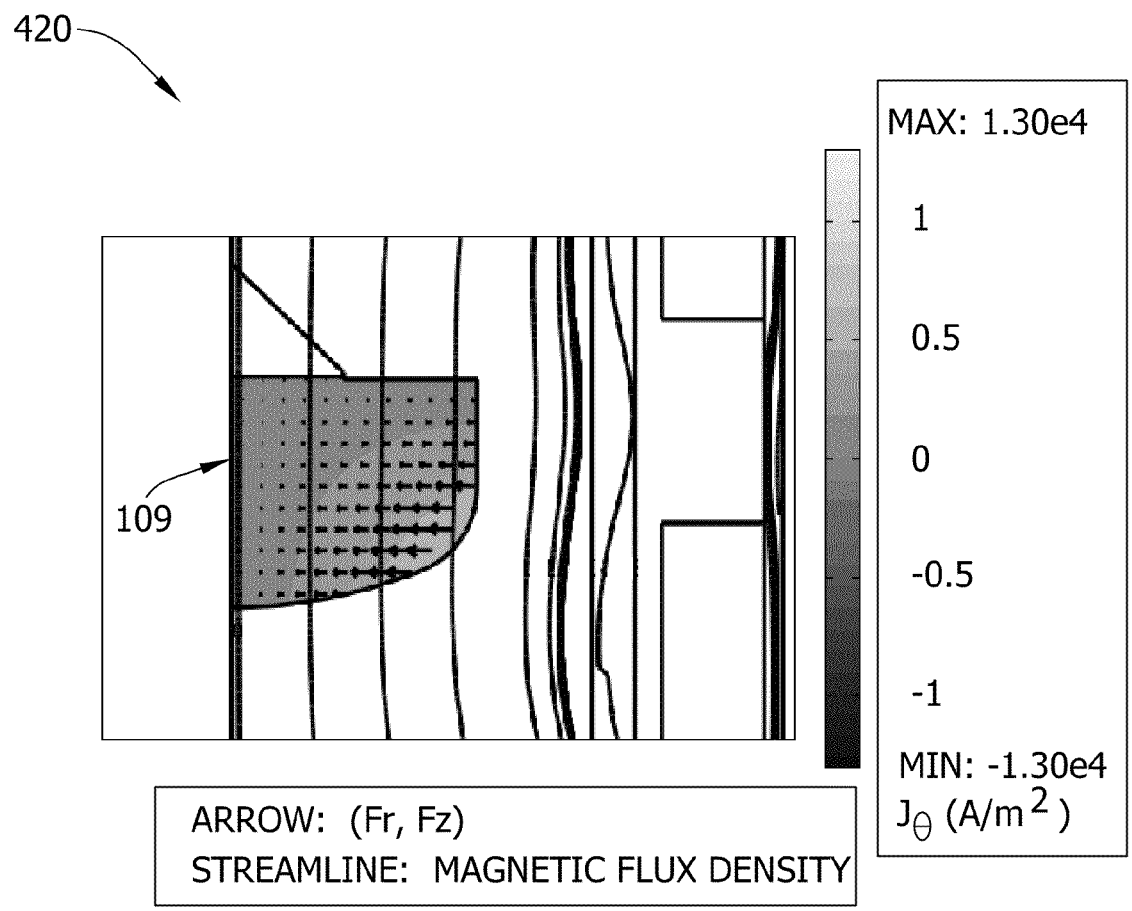

As the harmonic cycle proceeds, $I_{LAC}$ and $I_{UAC}$ maintain their 90 degree relationship, and the phase of both $I_{LAC}$ and $I_{UAC}$ goes forward with time. FIG. 15 shows instantaneous current, magnetic flux direction, and PCMP forces in the melt 109 at zero degrees in the AC cycle. FIG. 16 shows instantaneous current, magnetic flux direction, and PCMP forces in the melt 109 at 45 degrees in the AC cycle. FIG. 17 shows instantaneous current, magnetic flux direction, and PCMP forces in the melt 109 at 90 degrees in the AC cycle. FIG. 18 shows instantaneous current, magnetic flux direction, and PCMP forces in the melt 109 at 135 degrees in the AC cycle. The instantaneous current, flux, and force values for half of the AC cycle are shown in FIGS. 15-18. The maximum value of the body force varies between 250 and 300 N/m³ over the cycle, but the direction rotates, and the force distribution within the melt 109 changes. After an additional 45 degrees, the results would look like those in FIG. 15 again. For every half cycle of the harmonic currents, the direction of both J and B would reverse, so the direction of the forces would be unchanged after a half cycle. In this example, the AC frequency is 0.25 Hz, resulting in the frequency of the force field being 0.5 Hz.

Figure 19:
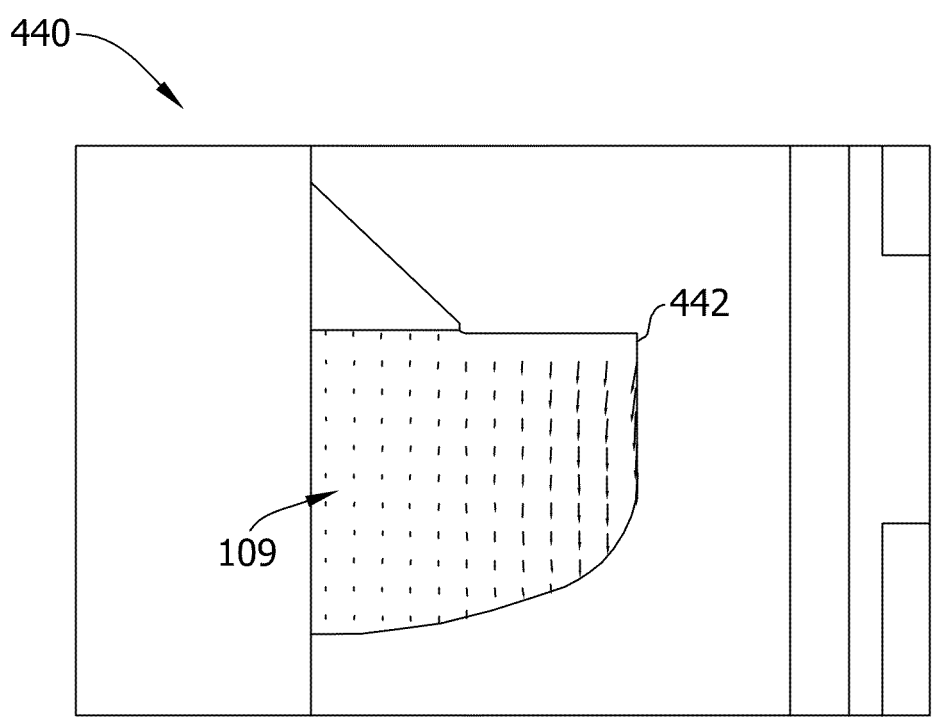

FIG. 19 is a partial cross-sectional view 440 of a portion of system 300 (shown in FIG. 10). More specifically, FIG. 19 illustrates a time-averaged force field in the melt 109 produced by sinusoidal magnet currents of amplitude 100 A and frequency 0.25 Hz, with $I_{UAC}$ leading $I_{LAC}$ by 90 degrees. The melt motion will be affected to some degree instantaneously by the instantaneous forces shown, but the more significant effects on melt motion will be due to the time-averaged forces, calculated using Equation 12. In an exemplary embodiment, the spatial distribution of the PCMP force (i.e., the time-averaged force) is shown in FIG. 19. In an exemplary embodiment, the PCMP force is generally downward, with a maximum magnitude of 105 N/m³ near an upper corner 442 of the melt 109. If this force field were scaled down by a factor of three, the maximum magnitude of the force would be about the value of the buoyant force calculated in Equation 2, for ΔT=100 K, and the spatial distribution would be not unlike the spatial distribution of the buoyant force field.

Figure 20:
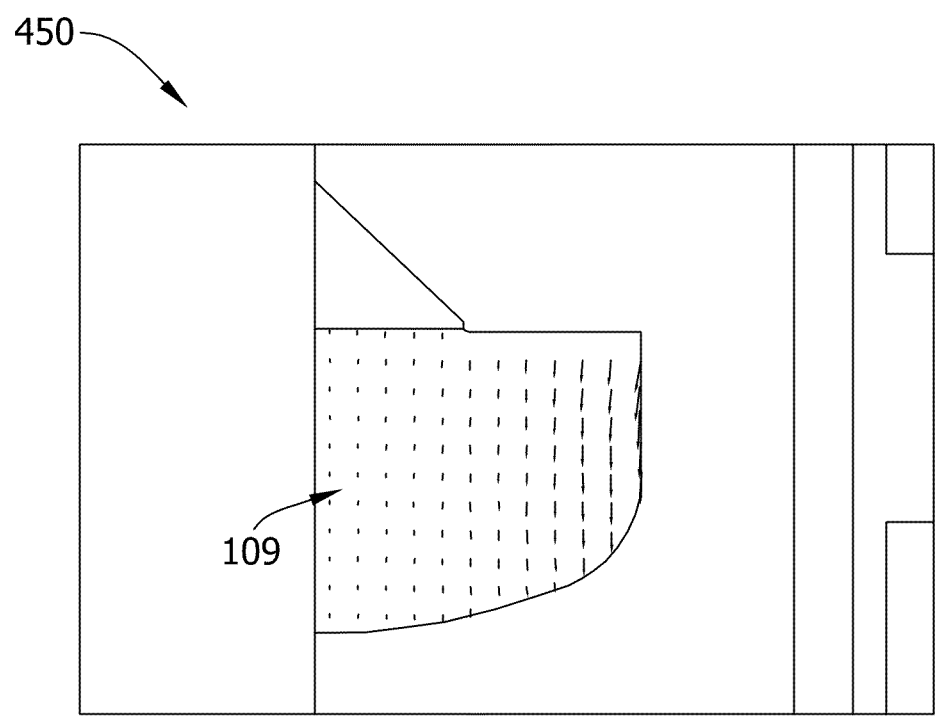
Figure 21:
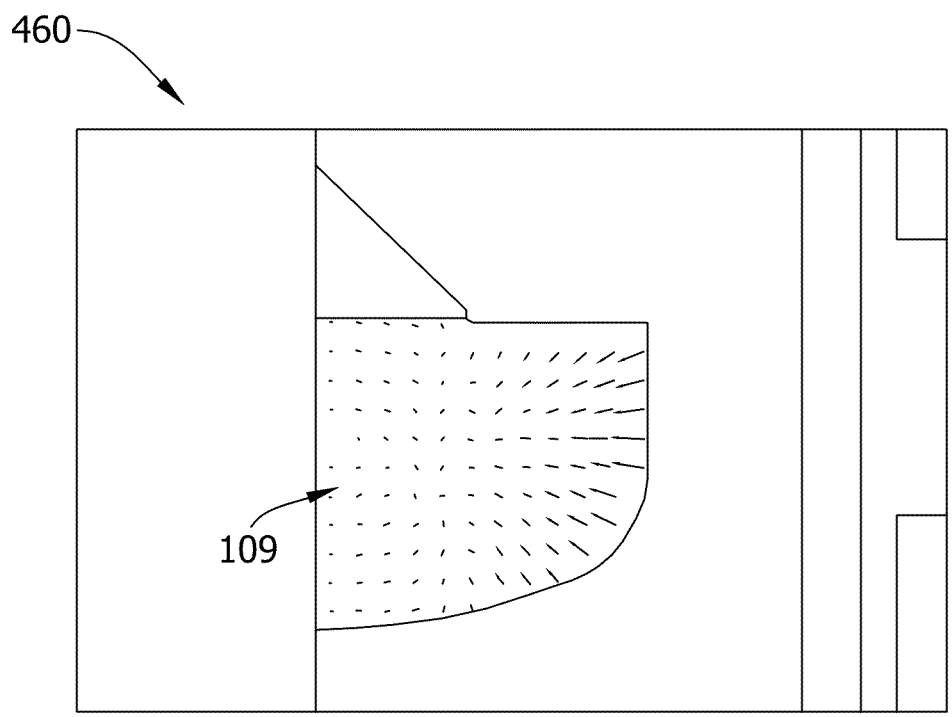
Figure 22:
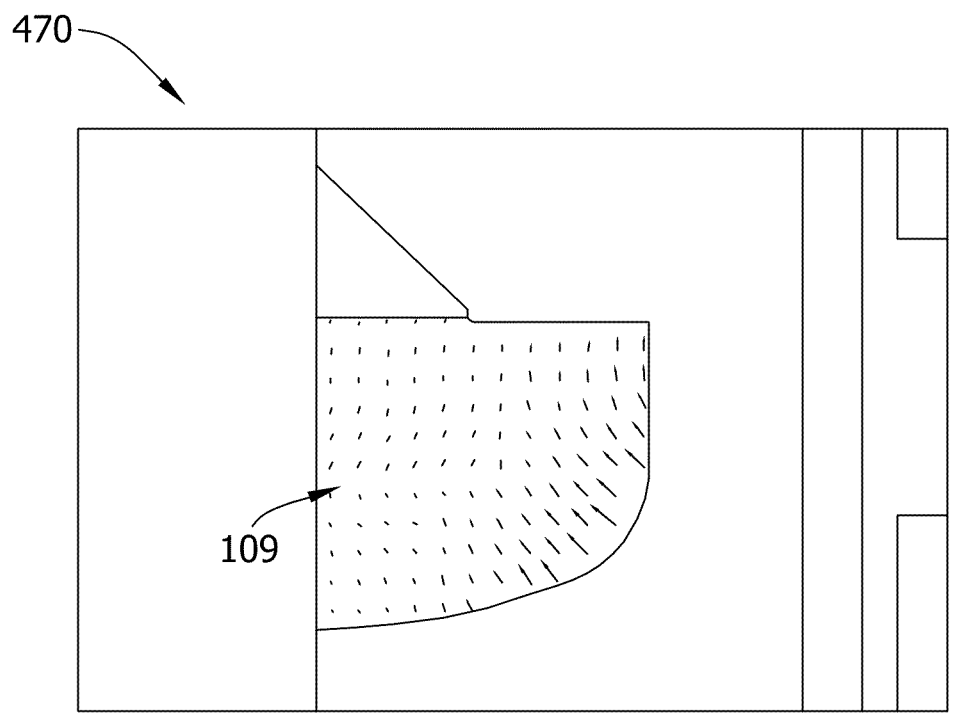
Figure 23:
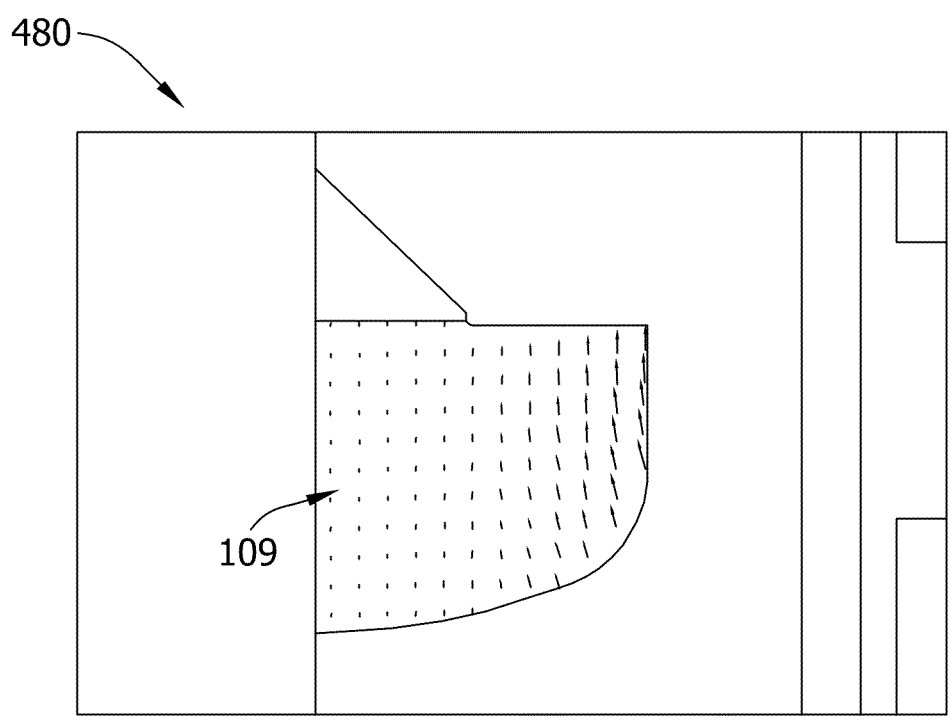

FIGS. 20-23 are partial cross-sectional views 450, 460, 470, and 480 of a portion of system 300 (shown in FIG. 10). More specifically, FIGS. 20-23 illustrate time-averaged force fields in the melt 109 produced by sinusoidal magnet currents of amplitude 100 A and frequency 0.25 Hz, where the phase relationship between $I_{UAC}$ and $I_{LAC}$ are changed. In FIG. 20, the phase of $I_{UAC}$ leads the phase of $I_{LAC}$ by 90 degrees. In FIG. 21, the phase of $I_{UAC}$ leads the phase of $I_{LAC}$ by zero degrees. In FIG. 22, the phase of $I_{UAC}$ leads the phase of $I_{LAC}$ by 180 degrees. In FIG. 23, the phase of $I_{UAC}$ leads the phase of $I_{LAC}$ by 270 degrees.

In FIGS. 20-23 the time-averaged forces for four different phase relationships are shown. FIG. 20 is the same as FIG. 19, with a 90 degree phase difference. In FIG. 21, the two currents are in phase with one another, corresponding to a cycling axial field, and the average force is only 16 N/m³. In FIG. 22, the two currents have opposite phases, corresponding to a cycling cusp field, and the average force is only 2.3 N/m³. In FIG. 23, $I_{UAC}$ leads $I_{LAC}$ by 270 degrees, and the PCMP force increases, to approximately 104 N/m³, but the force is now upward. FIGS. 20-23 illustrate the ability to control both the magnitude and the direction of the PCMP force by changing the amplitude and the relative phase of $I_{UAC}$ and $I_{LAC}$.

Figure 24:
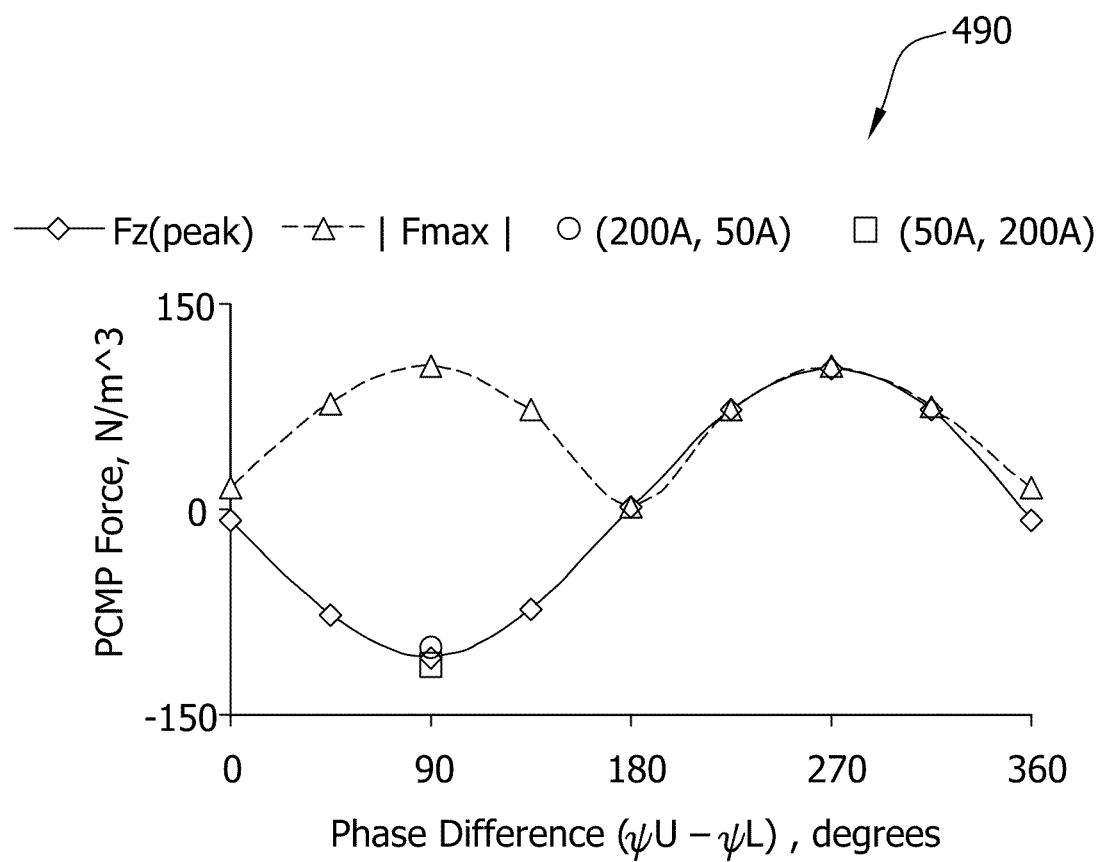
FIG. 24 is a chart illustrating the systematic nature of the dependence of the Phase Controlled Magnetic Pumping (PCMP) force upon the phase difference between $I_{UAC}$ and $I_{LAC}$.

FIG. 24 is a chart 490 illustrating the systematic nature of the dependence of the PCMP force upon the phase difference between $I_{UAC}$ and $I_{LAC}$. FIG. 24 shows peak values of time-averaged force field in the melt vs. the phase difference between $I_{UAC}$ and $I_{LAC}$, specifically for ($I_{LAC}$,$I_{UAC}$)=(100, 100). The axial component $F_z$ is plotted at the point in the melt where the magnitude of $F_z$ is largest. The largest magnitude of $F_z$ in the melt is also plotted. For $\phi_U - \phi_L = 90$ degrees, the force is also shown with ($I_{LAC}$, $I_{UAC}$)=(200, 50).

The maximum magnitude of the force in the melt and the peak value of $F_{z\_av}$ are shown for ($I_{LAC}$, $I_{UAC}$)=(100, 100) at all values of $\phi_U - \phi_L$. In addition, the values of $F_{z\_av}$ are shown for unequal currents ($I_{LAC}$, $I_{UAC}$)=(200, 50) and for ($I_{LAC}$, $I_{UAC}$)=(50, 200) when $\phi_U - \phi_L = 90$ degrees. This illustrates that the PCMP force is proportional to ($I_{LAC} \times I_{UAC}$).

Figure 25:
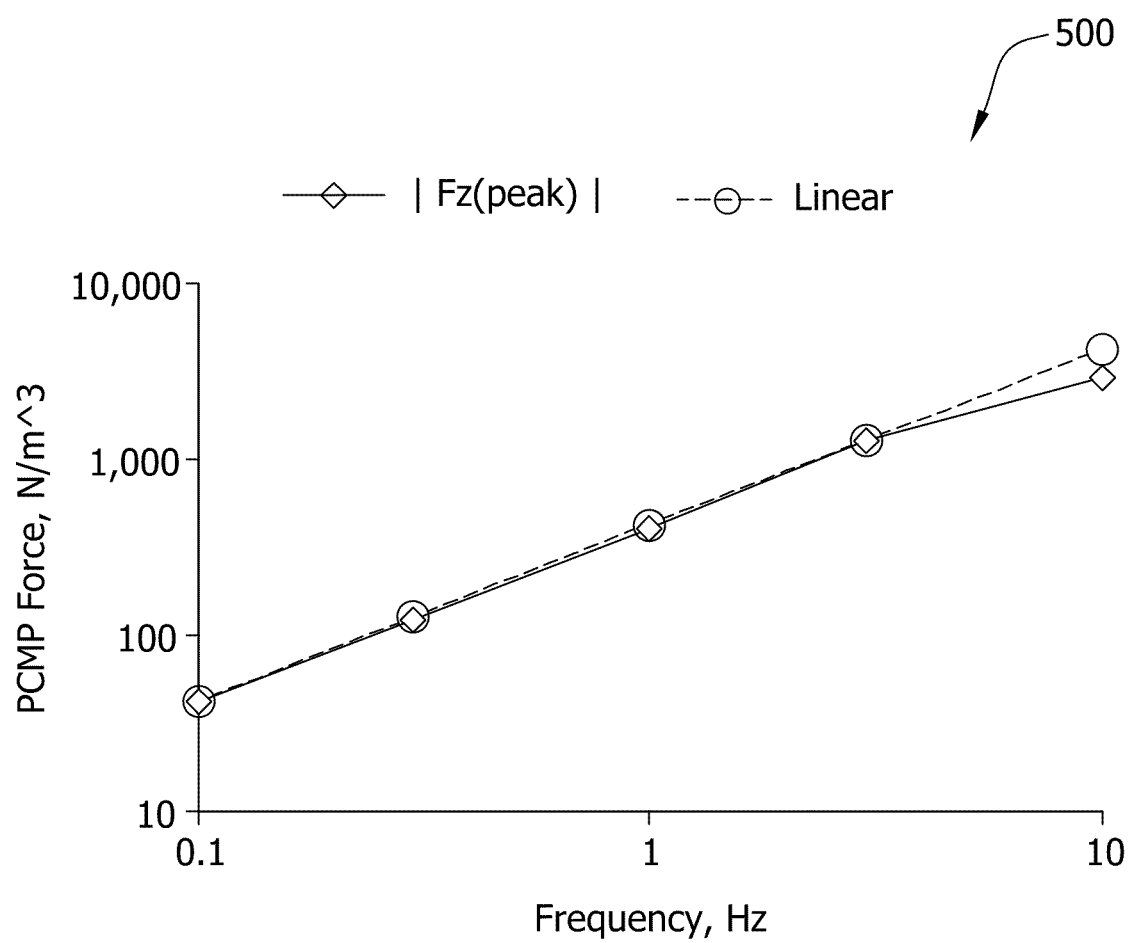
FIG. 25 is a chart illustrating the dependence of the PCMP force upon the frequency of $I_{UAC}$ and $I_{LAC}$.

FIG. 25 is a chart 500 illustrating the dependence of the PCMP force upon the frequency of $I_{UAC}$ and $I_{LAC}$. FIG. 25 illustrates a peak magnitude of a time-averaged force field in the melt vs. the frequency. In an exemplary embodiment, deviation from linearity is not apparent until the frequency is greater than 3 Hz. The PCMP force is linear with frequency until the frequency is greater than 3 Hz. At 3 Hz, the skin depth is approximately 0.25 m, and further reductions in skin depth begin to affect the behavior.

Figure 26:
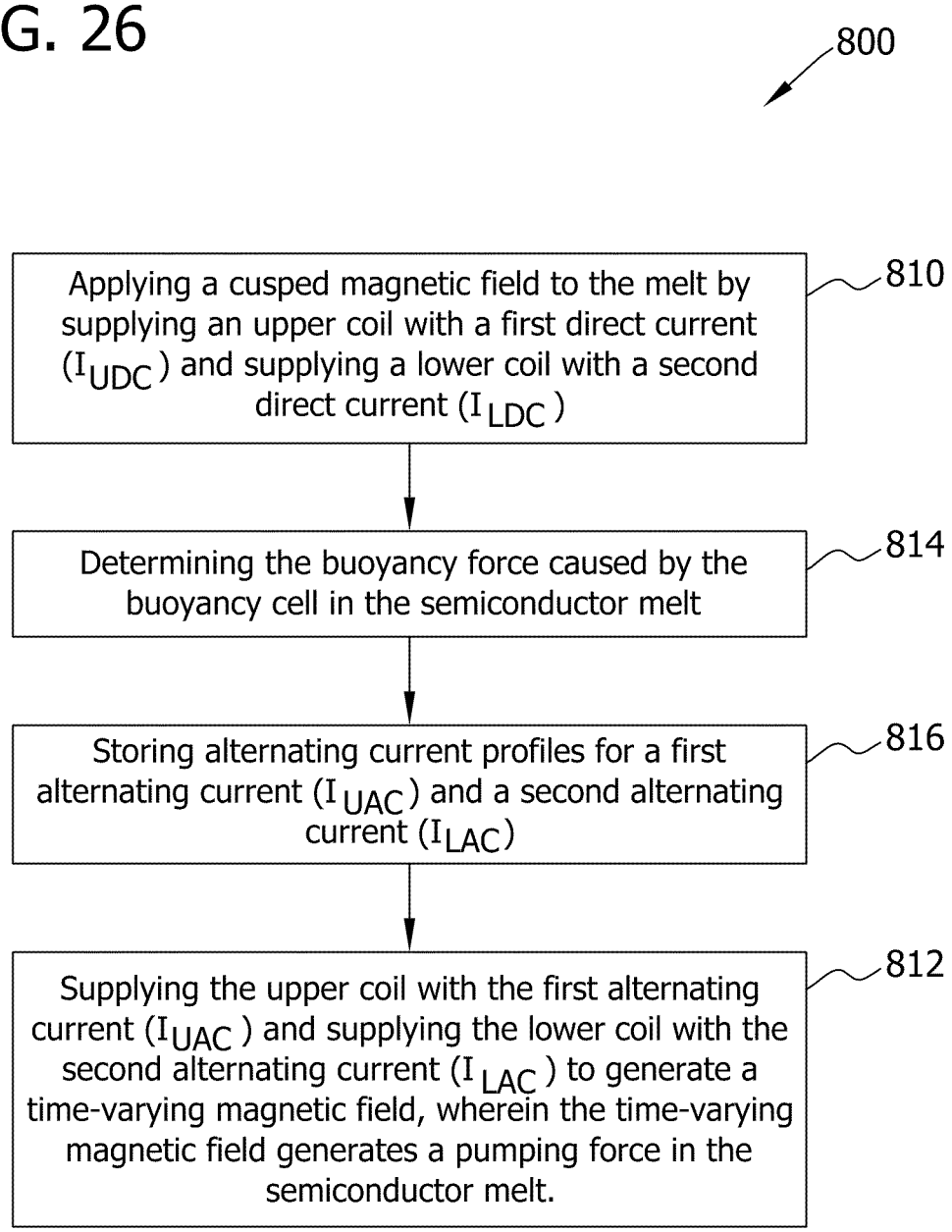
FIG. 26 is a flowchart of an exemplary method for controlling crystal growth in a crystal growing system, for example, the crystal growing system shown in FIG. 10.

FIG. 26 is a flowchart 800 of an exemplary method for controlling crystal growth in a crystal growing system, for example, crystal growing system 300 (shown in FIG. 10). The method includes applying 810 a cusped magnetic field to the melt by supplying an upper coil with a first direct current ($I_{UDC}$) and supplying a lower coil with a second direct current ($I_{LDC}$). The method also includes supplying 812 the upper coil with a first alternating current ($I_{UAC}$) and supplying the lower coil with a second alternating current ($I_{LAC}$) to generate a time-varying magnetic field, wherein the time-varying magnetic field generates a pumping force in the semiconductor melt. The time varying magnetic field is characterized by a fixed amplitude, frequency, and phase angle. In an exemplary embodiment, the pumping force increases with the product of the frequency and the magnitude of $I_{UAC}$ and $I_{LAC}$. As described above, the phase of the upper and lower currents of the coils define the direction of the pumping force. Predicted pumping forces generated with various sets of time-varying magnetic field parameters are provided in Table 2. The pumping forces are computed with the assumption that the relevant time scale of flow is substantially different from the time scale at which the magnetic field changes.

TABLE 2

Examples of Time-Varying Magnetic Field Parameters.

| Frequency (Hz) | $I_{UAC}$ (%) | $I_{LAC}$ (%) | $I_{UAC}$ phase (degrees) | $I_{LAC}$ phase (degrees) | Maximum Acceleration (m/sec$^2$) |
|---|---|---|---|---|---|
| 0.25 | 20 | 20 | 90 | 0 | −0.049 |
| 0.25 | 10 | 30 | 90 | 0 | −0.037 |
| 0.25 | 10 | 20 | 90 | 0 | −0.024 |
| 0.125 | 10 | 20 | 90 | 0 | −0.013 |
| 0.5 | 10 | 20 | 90 | 0 | −0.045 |
| 0.25 | 10 | 20 | 270 | 0 | 0.021 |
| 0.125 | 10 | 20 | 270 | 0 | 0.010 |
| 0.5 | 10 | 20 | 270 | 0 | 0.044 |

The pumping force generated by the time-varying magnetic field influences the existing melt flow in the liquid silicon melt during crystal growth. Specifically, the melt flow caused by the buoyant force is affected by the pumping force. A strong buoyancy cell typically has an effect of keeping the crystal melt interface hotter half-way between the center of the melt and the outer edge of the melt, rather than at the center of the melt. Higher temperatures half-way between the center of the melt and the outer edge of the melt causes a gull wing shape of the crystal-melt interface.

The method also includes determining 814 the buoyancy force caused by the buoyancy cell in the semiconductor melt and storing 816 alternating current profiles for $I_{UAC}$ and $I_{LAC}$ that cause $I_{UAC}$ and $I_{LAC}$ to generate a pumping force that opposes and weakens the buoyancy force in the semiconductor melt. A desired melt-solid interface shape is facilitated by generating the pumping force to oppose the buoyancy force and weaken the strength of the buoyancy force. More specifically, a central flow cell driven by a centrifugal effect, expands and allows melt to rise towards the center of the crystal, flow along a solidification front, and descend near the edge of the melt. As a result of the weakened buoyancy force, the temperature at the crystal-melt interface is reduced halfway between the center of the melt and the outer edge of the melt, which reduces the gull wing shape of the melt-solid interface. Reducing the gull wing shape facilitates formation of an increasingly parabolic shaped melt-solid interface.

In an exemplary embodiment, the behavior of the PCMP force field is regular and predictable. The amplitude dependence, phase dependence, and frequency dependence are all regular and well-behaved and are summarized in the figures described herein. To first order, the results in FIGS. 24 and 25 capture the overall behavior: for a specific system i, the maximum axial force in the melt is given by:

$$F_z(\text{peak}) = -C_i (I_{LAC} I_{UAC}) f \sin(\phi_U - \phi_L) \quad (13)$$

where Ci is a constant, specific to system i.

The direction of the PCMP force has not been treated in detail here, but FIGS. 20, 21, 22, and 23 show that the direction is continuously variable. Changes in the phase difference near 90 degrees and 270 degrees can be used to fine-tune the direction of the PCMP force field to approximately straight downward or straight upward. FIG. 24 shows that the magnitude of the force field is not reduced substantially for small tuning of the phase difference $\phi_U - \phi_L$.

Figure 27:
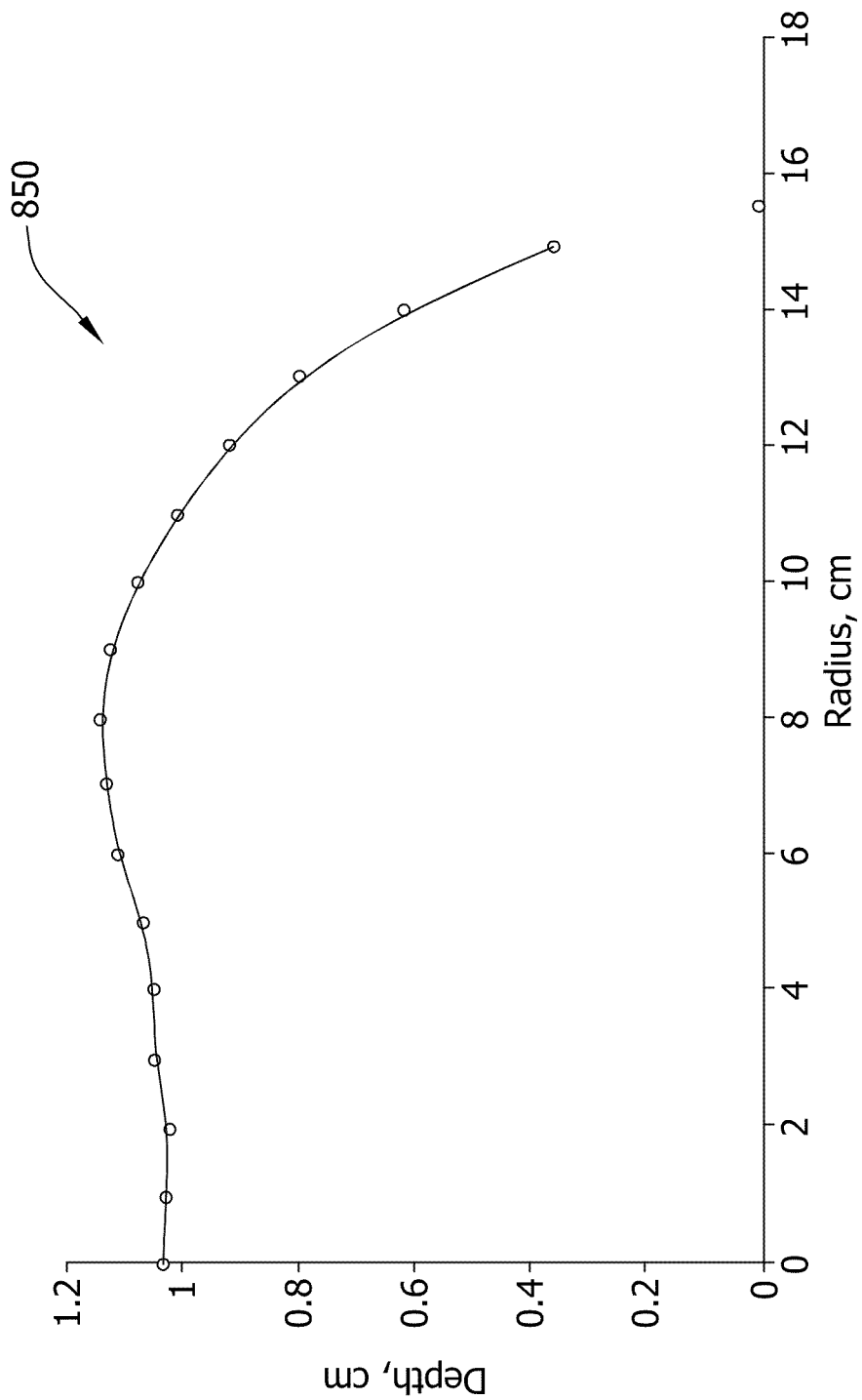
FIG. 27 is an illustration of an exemplary melt-solid interface.

FIG. 27 is an illustration of an exemplary melt-solid interface 850. More specifically, exemplary melt-solid interface 850 is an example of a melt-solid interface of a crystal grown under the presence of a cusped magnetic field, without the presence of the time-varying magnetic field described above. In the exemplary embodiment, the melt-solid interface 850 grown without the presence of the time-varying magnetic field described above, has a gull-wing shape.

Figure 28:
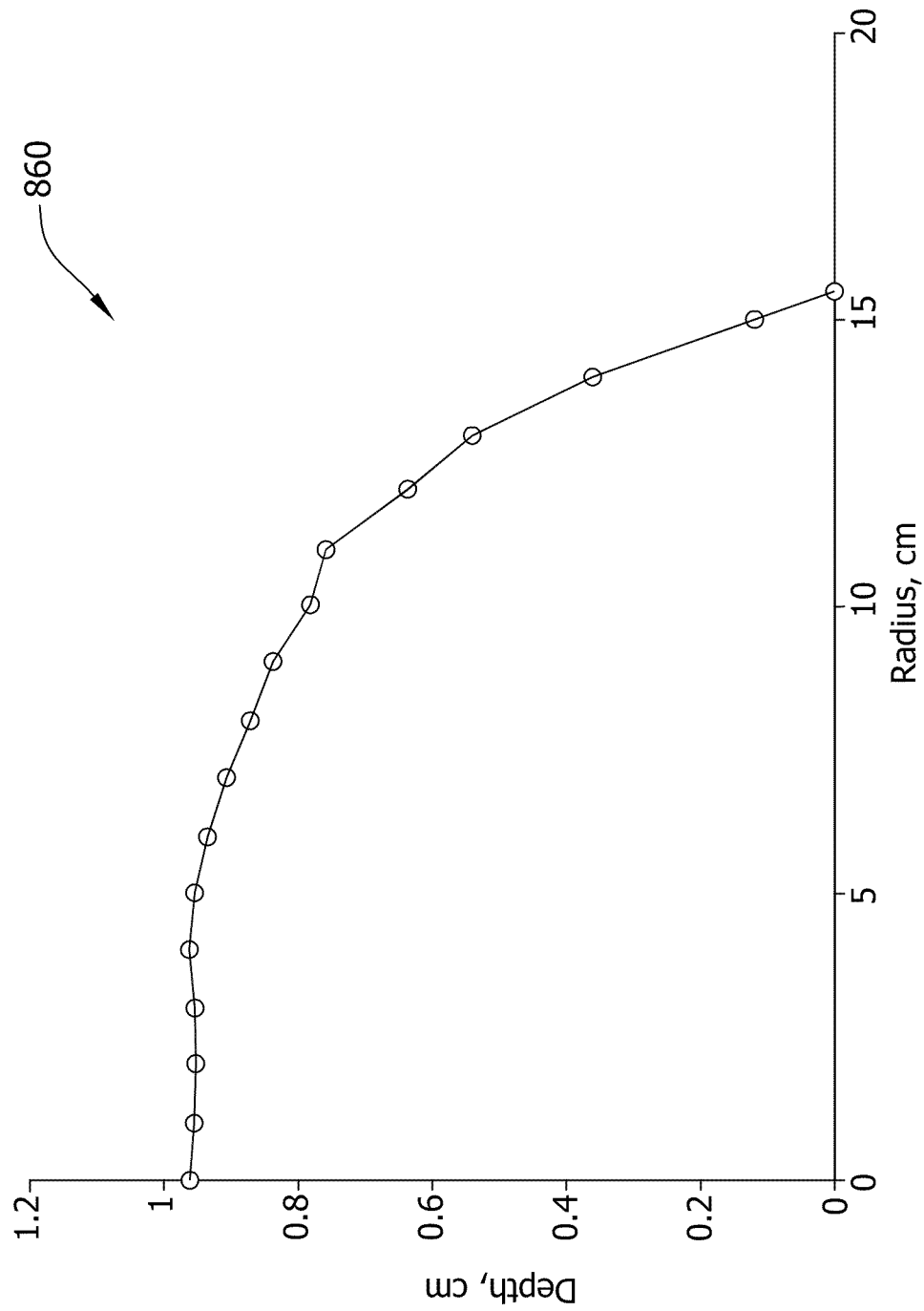
FIG. 28 is an illustration of an exemplary melt-solid interface.

FIG. 28 is an illustration of an exemplary melt-solid interface 860. More specifically, exemplary melt-solid interface 860 is an example of a melt-solid interface of a crystal grown under the presence of a time-varying magnetic field, as described above. In the exemplary embodiment, the melt-solid interface 860 is parabolic, in contrast to the gull-wing shape of melt-solid interface 850.

Figure 29:
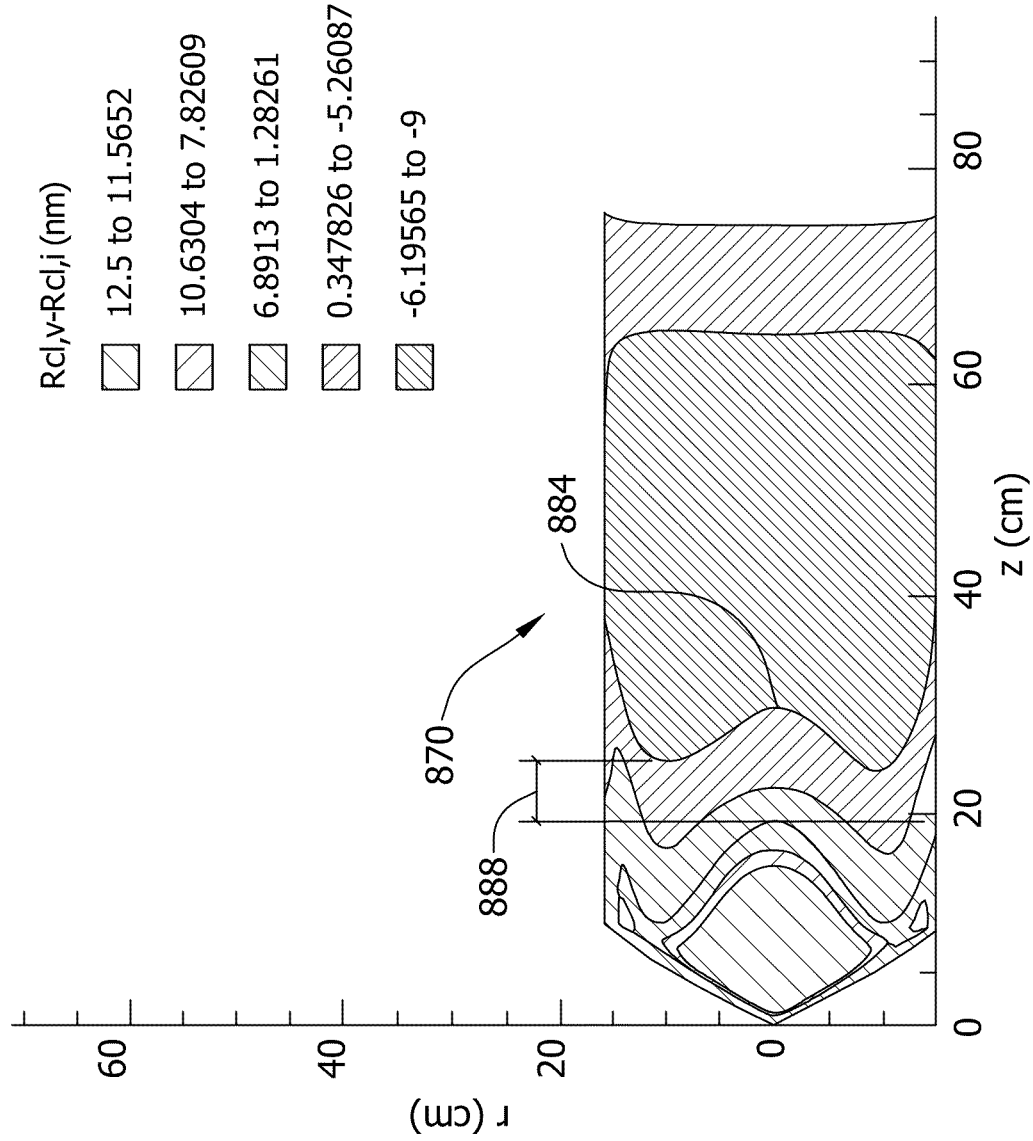
FIG. 29 is an exemplary defect transition diagram for a crystal grown without application of a time-varying magnetic field.
Figure 30:
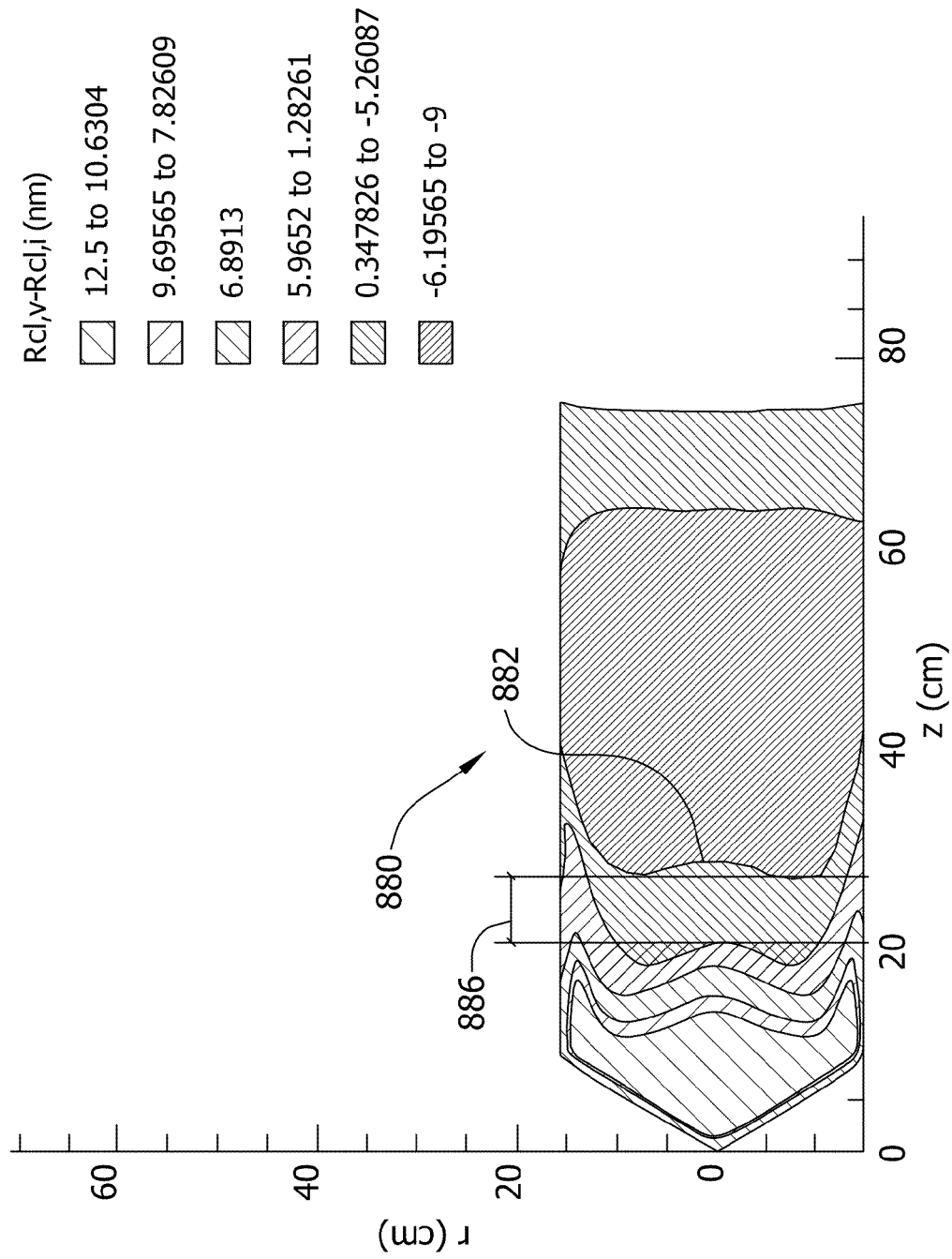
FIG. 30 is an exemplary defect transition diagram for a crystal grown with the application of a time-varying magnetic field.

FIG. 29 is an exemplary defect transition diagram 870 for a crystal grown without application of a time-varying magnetic field. FIG. 30 is an exemplary defect transition diagram 880 for a crystal grown with the application of a time-varying magnetic field. In the exemplary embodiment, defect distributions are predicted by a two dimensional defect model. Distributions of positive numbers indicate vacancy clusters and negative numbers indicate interstitial clusters. A defect transition 882 (shown in FIG. 30) is flatter than a defect transition 884 (shown in FIG. 29), resulting in a larger process window 886 (shown in FIG. 30) than process window 888 (shown in FIG. 29). Furthermore, the parabolic melt-solid interface shape facilitated by the application of the time-varying magnetic field during crystal growth also facilitates enlarging process window 886 compared to process window 888.

Figure 31:
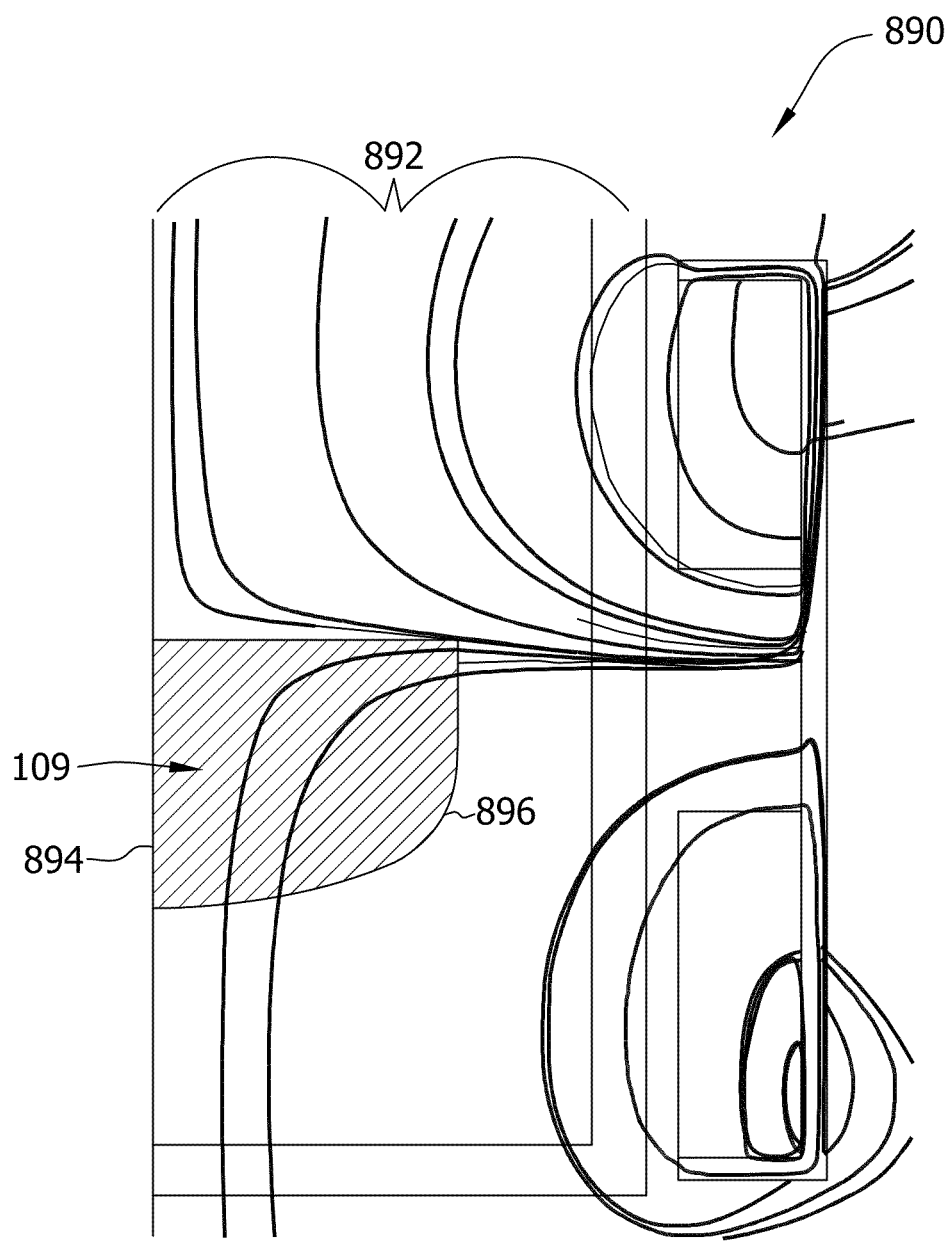
FIG. 31 is a partial cross-sectional view of a portion of the system shown in FIG. 10.

FIG. 31 is a partial cross-sectional view 890 of a portion of system 300 (shown in FIG. 10). More specifically, and as described above, FIG. 31 shows the instantaneous direction of magnetic field lines 892 and the instantaneous azimuthal current induced in the melt 109. FIG. 31 illustrates the instantaneous direction of magnetic field lines 892 and the instantaneous azimuthal current induced in the melt when the AC in the upper coil leads the AC in the lower coil by 90 degrees, and the phase of the lower AC is 45 degrees. In the exemplary embodiment, the current in the melt 109 is approximately zero at an axis 894 and increases to a maximum of approximately 6,986 A/m2 at an edge 896 of the melt 109.

As described herein, $I_{UAC}$ and $I_{LAC}$ are used as the process variables for simplicity, assuming a specific magnet conductor cross-sectional area, for example, $1.72 \times 10^{-4}$ m². This approach is convenient in that magnet power supplies would be designed to deliver specific currents independent of coil resistance and inductance. For static currents, the inductance is irrelevant, but for sinusoidal currents it can become a significant factor. Different magnets will have different detailed coil designs including the dimensions of the magnet, the conductor size and conductivity, the coil resistance, the number of turns, and the self and mutual inductance, so the characteristics of the power supply are considered as part of a process design.

Although a specific commercial system was modeled for this analysis to assure that the results accounted for realistic geometric and material properties, the analysis was done in a manner that readily allows extrapolation to other crystal growing systems. An arbitrary value of $\Delta T=100K$ was chosen to estimate representative buoyant forces in the melt, but straightforward scaling to other values of $\Delta T$ can be done. Currents are set to 100 A for both DC and AC components. Scaling the geometric dimensions, as well as current and frequency values, is possible to allow calculation of precise results for any crystal growing system.

The superposition of sinusoidal current signals upon static currents in the coils of axisymmetric cusp magnet systems on Cz crystal pullers provides a means to develop useful force fields in silicon melts in order to modify the melt flow. The force fields depend upon the magnitude, phase, and frequency of the sinusoidal currents in the respective magnet coils, but are independent of the static currents upon which the sinusoidal currents are superimposed. The effect of the AC parameters are described herein, and it is shown that forces equal to or greater than thermal buoyant forces can be developed with realistic magnet current programs, and both the magnitude and direction of the time-averaged forces can be programmed. Changes in the total force field (buoyant+PCMP force) can be achieved without hardware modification to the thermal or electromagnetic subsystems. If the buoyant forces provided by nature and the equipment designer are not optimum, they can be tuned or overridden.

The order of execution or performance of the methods illustrated and described herein is not essential, unless otherwise specified. That is, it is contemplated by the inventors that elements of the methods may be performed in any order, unless otherwise specified, and that the methods may include more or less elements than those disclosed herein. Moreover, although the invention is described above for use with a silicon melt, it is contemplated that the invention can be used with any other liquid semiconductor, liquid metal, and/or liquid conductor.

The methods and systems described herein may embrace one or more computer readable media, wherein each medium may be configured to include or includes thereon data or computer executable instructions for manipulating data. The computer executable instructions include data structures, objects, programs, routines, or other program modules that may be accessed by a processing system, such as one associated with a general-purpose computer capable of performing various different functions or one associated with a special-purpose computer capable of performing a limited number of functions. Computer executable instructions cause the processing system to perform a particular function or group of functions and are examples of program code means for implementing steps for methods disclosed herein. Furthermore, a particular sequence of the executable instructions provides an example of corresponding acts that may be used to implement such steps. Examples of computer readable media include random-access memory ("RAM"), read-only memory ("ROM"), programmable read-only memory ("PROM"), erasable programmable read-only memory ("EPROM"), electrically erasable programmable read-only memory ("EEPROM"), compact disk read-only memory ("CD-ROM"), or any other device or component that is capable of providing data or executable instructions that may be accessed by a processing system.

When introducing elements of the present invention or the embodiments thereof, the articles "a," "an," "the," and "said" are intended to mean that there are one or more of the elements. The terms "comprising," "including," and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for applying a time-varying magnetic field to counteract a buoyancy force caused by a buoyancy cell present in a semiconductor melt from which a monocrystalline ingot is grown according to a Czochralski process, the ingot being grown on a seed crystal pulled from the semiconductor melt, said method comprising:
   determining the buoyancy force caused by the buoyancy cell in the semiconductor melt;
   determining a direction and a magnitude of a pumping force to counteract the buoyancy force;
   determining one of a phase relationship between an upper coil alternating current ($I_{UAC}$) and a lower coil alternating current ($I_{LAC}$), a magnitude of $I_{UAC}$, and a magnitude of $I_{LAC}$ that will generate a time varying magnetic field that will produce the pumping force that opposes the direction of the buoyancy force in the semiconductor melt;
   supplying the upper coil with $I_{UAC}$ and supplying the lower coil with $I_{LAC}$ to generate the defined time-varying magnetic field, wherein the time-varying magnetic field generates the pumping force in the semiconductor melt; and
   applying the generated time-varying magnetic field to counteract the buoyancy force in the semiconductor melt to produce a melt-solid interface shape that is concave relative to the ingot, wherein the ingot has a diameter of at least two hundred millimeters.

2. A method in accordance with claim 1, wherein determining the direction and the magnitude of the pumping force further comprises determining a buoyancy force caused by the buoyancy cell in the semiconductor melt over time.

3. A method in accordance with claim 2, wherein defining characteristics of the time-varying magnetic field that will produce the pumping force further comprises defining the pumping force that opposes and weakens the buoyancy force caused by the buoyancy cell in the semiconductor melt.

4. A method in accordance with claim 2, wherein determining the direction and the magnitude of the pumping force to counteract the buoyancy force comprises computer modeling and analysis of a crystal growing system.

5. A method in accordance with claim 1, wherein applying the generated time-varying magnetic field to produce the melt-solid interface shape that is concave relative to the ingot comprises, producing a parabolic melt-solid interface shape that extends into the ingot and is without a gull-wing shape.

6. A method in accordance with claim 1, wherein applying the generated time-varying magnetic field to produce a melt-solid interface shape that is concave relative to the ingot comprises, producing a melt-solid interface shape having a height of zero inches at an edge of the ingot and a height that is greater than zero at a center of the ingot.

7. A method in accordance with claim 6 further comprising producing a melt-solid interface shape not having a local minimum height in a curve connecting the edge of the ingot to the center of the ingot along the melt-solid interface.

8. A method in accordance with claim 1 further comprising producing an ingot having a diameter that is at least three hundred millimeters.

9. A system for applying a time-varying magnetic field to counteract a buoyancy force present in a semiconductor melt from which a monocrystalline ingot is grown according to a Czochralski process, the ingot being grown on a seed crystal pulled from the melt, said system comprising:
    a first set of coils and a second set of coils for generating a magnetic field, wherein said first set of coils and said second set of coils are positioned adjacent to an exterior of a crucible configured to facilitate production of an ingot having a diameter of greater than two hundred millimeters; and
    a control unit comprising a processor configured to determine:
        a direction and a magnitude of a pumping force to counteract the buoyancy force; and
        one of a phase relationship between an upper coil alternating current ($I_{UAC}$) and a lower coil alternating current ($I_{LAC}$), a magnitude of $I_{UAC}$, and a magnitude of $I_{LAC}$ that will generate a time varying magnetic field that will produce the pumping force to counteract the buoyancy force in the semiconductor melt
    said control unit configured to supply $I_{UAC}$ to said first set of coils and $I_{LAC}$ to said second set of coils to generate the time-varying magnetic field to produce the pumping force to counteract the buoyancy force of the buoyancy cell and produce a melt-solid interface shape that is concave relative to the ingot.

10. A system in accordance with claim 9, wherein said control unit is further configured to store a plurality of phases for $I_{UAC}$ and $I_{LAC}$, wherein the phase determines the direction of the pumping force.

11. A system in accordance with claim 9, wherein said control unit is further configured to store a plurality of magnitudes for $I_{UAC}$ and $I_{LAC}$, wherein the magnitude of $I_{UAC}$ and $I_{LAC}$ determines the magnitude of the pumping force.

12. A system in accordance with claim 9, wherein said control unit is further configured to supply a direct current (DC) current to at least one of said first set of coils and said second set of coils.

13. A system in accordance with claim 12, wherein said control unit superimposes at least one of $I_{UAC}$ and $I_{LAC}$ on said at least one DC current.

14. A method for generating a pumping force in a semiconductor melt undergoing a Czochralski process of monocrystalline silicon ingot growth, said method comprising:
    determining a direction and a magnitude of a pumping force to counteract a buoyancy force present in the semiconductor melt;
    storing alternating current profiles for a first alternating current ($I_{UAC}$) and a second alternating current ($I_{LAC}$), the alternating current profiles comprising at least one of a phase relationship between $I_{UAC}$ and $I_{LAC}$, a frequency for $I_{UAC}$, a frequency for $I_{LAC}$, a magnitude of $I_{UAC}$, and a magnitude of $I_{LAC}$;
    energizing a first coil and a second coil with $I_{UAC}$ and $I_{LAC}$, respectively, to generate a time-varying magnetic field; and
    applying the time-varying magnetic field to the semiconductor melt to generate the pumping force in the semiconductor melt to produce a melt-solid interface shape that is concave relative to the ingot.

15. A method in accordance with claim 14, wherein the magnitudes and phase angles of $I_{UAC}$ and $I_{LAC}$ determine a magnitude and a direction of the generated pumping force.

16. A method in accordance with claim 14, wherein applying the time-varying magnetic field to the semiconductor melt comprises applying the time-varying magnetic field to a semiconductor melt during the process of producing a semiconductor ingot having a diameter of greater than two hundred millimeters.

* * * * *